United States Patent
Sezginer et al.

(10) Patent No.: US 7,230,703 B2
(45) Date of Patent: Jun. 12, 2007

(54) APPARATUS AND METHOD FOR MEASURING OVERLAY BY DIFFRACTION GRATINGS

(75) Inventors: Abdurrahman Sezginer, Los Gatos, CA (US); Robert Shinagawa, Cupertino, CA (US); Hsu-Ting Huang, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 457 days.

(21) Appl. No.: 10/858,587

(22) Filed: Jun. 2, 2004

(65) Prior Publication Data

US 2005/0012928 A1    Jan. 20, 2005

Related U.S. Application Data

(60) Provisional application No. 60/519,345, filed on Nov. 12, 2003, provisional application No. 60/488,067, filed on Jul. 17, 2003.

(51) Int. Cl.
*G01B 11/00* (2006.01)

(52) U.S. Cl. ..................................... 356/401
(58) Field of Classification Search .................. None
See application file for complete search history.

(56) References Cited

U.S. PATENT DOCUMENTS

| | | | |
|---|---|---|---|
| 4,378,159 A | 3/1983 | Galbraith | 356/237 |
| 4,757,207 A | 7/1988 | Chappelow et al. | 250/491.1 |
| 6,023,338 A | 2/2000 | Bareket | 356/401 |
| 6,458,605 B1 | 10/2002 | Stirton | 438/7 |
| 6,462,818 B1 | 10/2002 | Bareket | 356/401 |
| 6,667,805 B2 | 12/2003 | Norton et al. | 356/326 |
| 7,046,361 B1* | 5/2006 | Yang et al. | 356/401 |
| 2002/0158193 A1 | 10/2002 | Sezginer et al. | 250/237 |
| 2003/0021465 A1 | 1/2003 | Adel et al. | 382/151 |
| 2003/0021467 A1 | 1/2003 | Adel et al. | 382/151 |
| 2003/0042579 A1 | 3/2003 | Schulz | 257/629 |
| 2003/0043372 A1 | 3/2003 | Schulz | 356/327 |
| 2003/0044702 A1 | 3/2003 | Schulz | 430/30 |
| 2003/0133102 A1 | 7/2003 | Opsal | 356/237.1 |
| 2003/0190793 A1 | 10/2003 | Brill et al. | 438/401 |
| 2003/0223630 A1 | 12/2003 | Adel et al. | 382/145 |
| 2004/0066517 A1 | 4/2004 | Huang et al. | 356/509 |
| 2004/0246482 A1* | 12/2004 | Sezginer et al. | 356/401 |

FOREIGN PATENT DOCUMENTS

WO    WO 02/069390 A2    9/2002

OTHER PUBLICATIONS

In re U.S. Appl. No. 10/613,378, by Sezginer et al., entitled "Overlay Metrology Method and Apparatus Using More Than One Grating Per Measurement Direction," filed Jul. 3, 2003, 31 pages in length.

(Continued)

*Primary Examiner*—Gregory J. Toatley, Jr.
*Assistant Examiner*—Gordon J. Stock, Jr.
(74) *Attorney, Agent, or Firm*—Stallman & Pollock LLP

(57) ABSTRACT

A method for measuring overlay in a sample includes obtaining an image of an overlay target that includes a series of grating stacks each having an upper and lower grating, each grating stack having a unique offset between its upper and lower grating. The image is obtained with a set of illumination and collection optics where the numerical aperture of the collection optics is larger than the numerical aperture of the illumination optics and with the numerical apertures of the illumination and collection optics are selected so that the unit cells of gratings are not resolved, the grating stacks are resolved and they appear to have a uniform color within the image of the overlay target.

20 Claims, 12 Drawing Sheets

OTHER PUBLICATIONS

M. Adel et al., "Characterization of Overlay Mark Fidelity," *SPIE*, vol. 5038 (paper 5038-43), 2003, 8 pages in length.

W. Yang et al., "A Novel Diffraction Based Spectroscopic Method for Overlay Metrology," *PAPER-SPIE ML*-02-Feb. 20030 [*SPIE's 28th Annual International Symposium and Education Program on Microlithography*, Feb. 2003], pp. 1-9.

J. Bischoff et al., "Light Diffraction Based Overlay Measurement," *Metrology, Inspection, and Process Control for Microlithography XV*, Neal T. Sullivan, Editor [*Proceedings of SPIE*], vol. 4344 (2001), pp. 222-233.

P. Heimann, "The Color-Box alignment vernier: a sensitive lithographic alignment vernier read at low magnification," *Optical Engineering*, vol. 29, No. 7, Jul. 1990, pp. 828-836.

H-T Huang et al., "Scatterometry-Based Overlay Metrology," *Metrology, Inspection, and Process Control for Microlithography XVII, Proceedings of SPIE*, vol. 5038 (2003), pp. 126-137.

T.A. Germer, "Measurement of lithographic overlay by light scattering ellipsometry," *Surface Scattering and Diffraction for Advanced Metrology II, Proceedings of SPIE*, vol. 4780 (2002) pp. 72-79.

SEMI P28-96, "Specification for Overlay-Metrology Test Patterns for Integrated-Circuit Manufacture," *specification SEMI P28-96, Semiconductor Equipment and Materials International*, San Jose, CA, 1996, 4 pages in length.

* cited by examiner

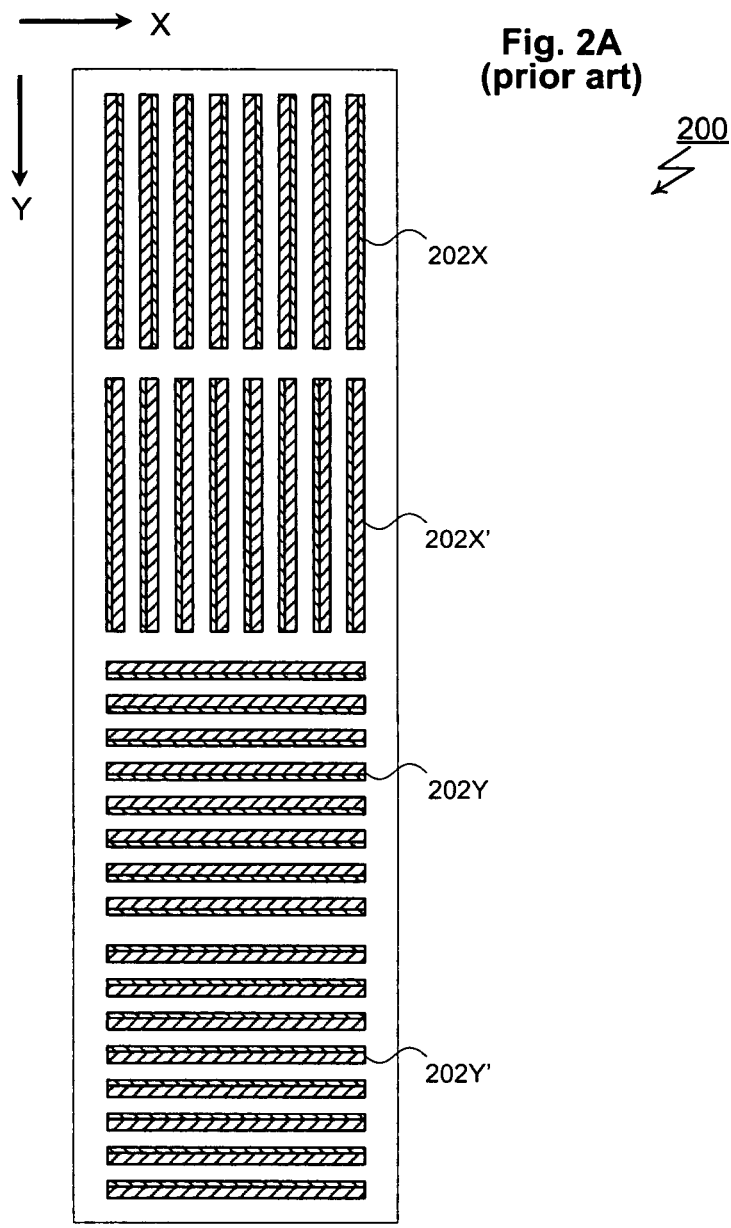
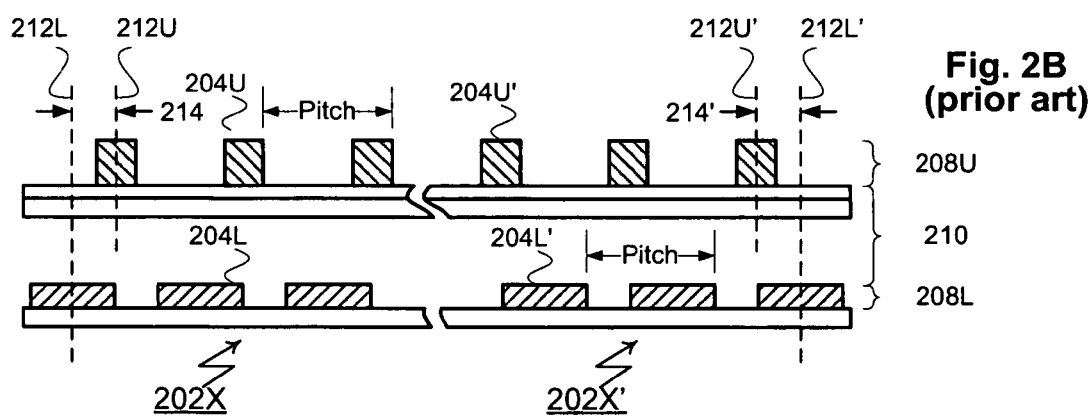

500

APPARATUS AND METHOD FOR MEASURING OVERLAY BY DIFFRACTION GRATINGS

PRIORITY CLAIM

The present application claims priority to U.S. Provisional Patent Application Ser. No. 60/488,067, filed Jul. 17, 2003, and U.S. Provisional Patent Application Ser. No. 60/519,345, filed Nov. 12, 2003, both of which are incorporated in this document by reference.

RELATED APPLICATION

The subject matter of the present application is related to the disclosure included in a concurrently filed U.S. patent application Ser. No. 10/858,691 entitled: "DIFFRACTING, APERIODIC TARGETS FOR OVERLAY METROLOGY AND METHOD TO DETECT GROSS OVERLAY". The disclosure of that related application is incorporated herein by reference.

TECHNICAL FIELD

This invention relates to measuring the alignment of a pair of patterned layers on a semiconductor wafer, possibly separated by one or more layers, made by two or more lithography steps during the manufacture of semiconductor devices.

BACKGROUND OF THE INVENTION

Manufacturing semiconductor devices involves depositing and patterning several layers overlaying each other. For example, gate interconnects and gates of an integrated circuit are formed at different lithography steps in the manufacturing process. The tolerance of alignment of these patterned layers is less than the width of the gate.

Overlay is defined as the displacement of a patterned layer from its ideal position aligned to a layer patterned earlier on the same wafer. Overlay is a two dimensional vector ($\Delta x$, $\Delta y$) in the plane of the wafer. Overlay is a vector field, i.e., the value of the vector depends on the position on the wafer. Perfect overlay and zero overlay are used synonymously. Overlay and overlay error are used synonymously. Depending on the context, overlay may signify a vector or one of the components of the vector.

Overlay metrology provides the information that is necessary to correct the alignment of the stepper-scanner and thereby minimize overlay error on subsequent wafers. Overlay errors, detected on a wafer after exposing and developing the photoresist, can be corrected by removing the photoresist and repeating the lithography step on a corrected stepper-scanner. If the measured error is minor, parameters for subsequent steps of the lithography process could be adjusted based on the overlay metrology to avoid excursions.

Most prior overlay metrology methods use metrology targets that are etched or otherwise formed into or on the various layers during the same plurality of lithography steps that form the patterns for circuit elements on the wafer. One typical pattern, called "box-in-box" consists of two concentric squares, formed on a lower and an upper layer, respectively. "Bar-in-bar" is a similar pattern with just the edges of the "boxes" demarcated, and broken into disjoint line segments ("Specification For Overlay-Metrology Test Patterns For Integrated-Circuit Manufacture", specification SEMI P28-96, Semiconductor Equipment and Materials International, San Jose, Calif., 1996) The outer bars are associated with one layer and the inner bars with another. Typically one is the upper pattern and the other is the lower pattern, e.g., outer bars on a lower layer, and inner bars on the top. However, with advanced processes the topographies are complex and not truly planar so the designations "upper" and "lower" are ambiguous. Typically they correspond to earlier and later in the process. The squares or bars are formed by lithographic and other processes used to make planar structures, e.g., chemical-mechanical planarization (CMP). Currently, the patterns for the boxes or bars are stored on lithography masks and projected onto the wafer. Other methods for putting the patterns on the wafer are possible, e.g., direct electron beam writing from computer memory, and imprint lithography.

In one form of the prior art, a high performance microscope imaging system combined with image processing software estimates overlay error for the two layers. The image processing software uses the intensity of light at a multitude of pixels. Obtaining the overlay error accurately requires a high quality imaging system and means of focusing the system. One requirement for the optical system is very stable positioning of the optical system with respect to the sample. Relative vibration would blur the image and degrade the performance. This is a difficult requirement to meet for overlay metrology systems that are integrated into a process tool, like a lithography track. High-acceleration wafer handlers in the track cause vibration. The tight space requirements for integration do not favor bulky isolation strategies.

As disclosed in U.S. Patent Application Ser. No. 2002/0158193 (incorporated in this document by reference) one approach to overcoming these difficulties is to incorporate overlay metrology targets that comprise diffraction gratings within semiconductor wafers. The targets are measured using scatterometry to perform overlay metrology. Several different grating configurations are described for the overlay targets. The simplest embodiment uses two grating stacks, one for x-alignment and one for y (each grating stack comprising two grating layers, one in the lower layer, the other in the upper layer). An alternative embodiment uses two line grating stacks each for x and y (four grating stacks total). Still another embodiment uses three line grating stacks in combination to simultaneously measure both x and y alignment. (See also PCT publication WO 02/25723A2, incorporated herein by reference).

In FIG. 1A, one possible implementation for an overlay target is shown and generally designated 100. Target 100 includes two grating stacks labeled 102X and 102Y. Grating stack 102X is used to measure overlay in the x-direction while grating stack 102Y is used to measure overlay in the y-direction. Target 100 is typically included in an unused wafer portion (such as within a scribe line). This prevents overlay target 100 from interfering with devices included on the semiconductor wafer.

FIG. 1B shows the structural details of grating stack 102X (and, by analogy grating stack 102Y). As shown, grating stack 102X includes an upper grating 104U and a lower grating 104L. Gratings 104U and 104L have the same pitch 106 (in this document, period, spatial period, and pitch are used synonymously). Grating 104U is formed in an upper layer 108U and grating 104L is formed in a lower layer 108L. Upper and lower layers 108 may be separated by one or more intermediate layers 110.

To describe alignment between layers 108, FIG. 1B shows a symmetry plane 112U (for grating 104U and layer 108U) and symmetry plane 112L (for grating 104L and layer 108L). Symmetry plane 112U is offset from symmetry plane 112L by offset 114 (i.e., offset 114 is equal to x(112U)−x(112L)), the difference between the x-coordinates of the symmetry planes 112U and 112L. The value of offset 114 when the lithography is in perfect alignment is the offset bias of the grating stack 102X.

Offset bias is synonymously called reticle offset because it is produced by introducing an offset into the data that is written to the reticle set. Reticles are transparent, patterned plates. The pattern on the reticle is transferred to the wafer by lithography. The offset bias is produced by shifting the pattern of grating 104U in the reticle for the layer 108U with respect to the pattern of grating 104L in the reticle for the layer 108L, or vice versa.

An offset bias that is not an integer multiple of pitch/2 enables distinguishing the sign of the overlay. Symmetry planes 112 in FIG. 1B are not uniquely defined since there is one such symmetry plane for each line in gratings 104U and 104L. The magnitude of the offset bias is understood to be the least distance between any choice of symmetry plane 112U in grating 104U and any choice of symmetry plane 112L in grating 104L. For a stack of two overlaying line gratings, the best value for offset bias is equal to pitch/4 or −pitch/4. The term symmetric line grating is defined by the following property: The unit cell of a symmetric line grating can be selected in a way that renders the unit cell substantially invariant under reflection with respect to a plane that is perpendicular to the direction of the pitch. Small geometric imperfections, such as line edge roughness, that do not significantly affect optical measurements are not construed to break the symmetry.

Overlay measurements are obtained by measuring the optical responses of grating stacks 102X and 102Y, typically in sequence. The optical response can be measured by spectroscopic reflectometry, or spectroscopic ellipsometry, which do not spatially resolve the grating lines in grating stacks 102X and 102Y. Overlay measurements are then calculated from the optical measurements by regression.

In FIG. 2A, another possible implementation for an overlay target is shown and generally designated 200. Overlay target 200 includes two grating stacks for each direction in which overlay is to be measured. Grating stacks 202X and 202X' are used for measurements in the x direction. Grating stacks 202Y and 202Y' are used for measurements in the y direction. The use of two grating stacks per direction offers significantly more robust measurement of overlay when compared to the implementations of FIGS. 1A and 1B.

FIG. 2B shows the structural details of grating stacks 202X and 202X' (and, by analogy grating stacks 202Y and 202Y'). As shown, grating stack 202X includes an upper grating 204U and a lower grating 204L. Grating stack 202X' includes an upper grating 204U' and a lower grating 204L'. Gratings 204U, 204L, 204U' and 204L' have the same pitch 106. Gratings 204U and 204U' are formed in an upper layer 208U and gratings 204L and 204L' are formed in a lower layer 208L. Upper and lower layers 208 may be separated by one or more intermediate layers 210. Patterned layers 208L and 208U may be formed on the same layer sequentially, in which case there are no intermediate layers 210. For example, both gratings may be etched at the zero-level on a silicon wafer to qualify a lithography projector. There may be zero or more layers between the substrate of the wafer and patterned layer 208L.

When layers 208U and 208L are in perfect alignment, grating stacks 202X and 202X' are reflections of each other with respect to the x-axis. Grating stack 202X' can be obtained from grating stack 202x by the following transformation: (x', y')=(c1−x,c2+y) where c1 and c2 are constant distances. Similarly, under perfect alignment, grating stacks 202Y and 202Y' are related by reflection with respect to the y-axis. Grating stack 202Y' can be obtained from grating stack 202Y by the following transformation: (x',y')=(c3+x, c4−y) where c3 and c4 are constant distances.

To describe alignment between layers 208, FIG. 2B shows two symmetry planes for grating stack 202x. These are labeled 212U (for upper grating 204U) and 212L (for lower grating 204L). FIG. 2B also shows two symmetry planes for grating stack 202X'. These are labeled 212U' (for upper grating 204U') and 212L' (for lower grating 204L'). Offset 214 is x(212U)−x(212L). Offset 214' is x(212U')−x(212L'). At perfect alignment, the value of offset 214 is pitch/4 and the value of offset 214' is −pitch/4. The value of offset 214 at perfect overlay is called the offset bias of grating stack 202X. Grating stack 202X and 202X' then have the same optical properties when they are viewed by a polarization insensitive reflectometer. When the upper layer is shifted in the x-direction by an overlay Δx smaller than pitch/4 in magnitude, the magnitude of offset 214 becomes (pitch/4+Δx) and the magnitude of offset 214' becomes (pitch/4−Δx). This breaks the reflection symmetry of grating stacks 202X and 202X' and their optical responses differ. Optical measurements from grating stacks 202X and 202X' are fitted simultaneously with a model of the grating stacks 202X and 202X' to regress the offset Δx (Huang et al., "Scatterometry-Based Overlay Metrology," Proc. SPIE Vol. 5038, p126–137, SPIE Bellingham, Wash., 2003):

$$\min_{\Delta x} \sum_{\lambda} \{[R(\lambda, \Delta x, Meas.at(202\,X)) - R(\lambda, \Delta x, \text{Model}(202\,X))]^2 + \\ [R(\lambda, \Delta x, Meas.at\,(202\,X')) - R(\lambda, \Delta x, \text{Model}(202\,X'))]^2\}$$

Eq. 1

The summation in Eq. 1 is over wavelengths (λ) at which measurements are taken. In the model based regression, the offsets 214 and 214' depend solely on the unknown overlay Δx. All other parameters, such as thicknesses of deposited layers, line widths and heights are common to the models of grating stacks 202X and 202X' since the two grating stacks are next to each other and are subject to the same process conditions. The minimization above is with respect to Δx and other parameters of the model, such as thicknesses of layers are not shown in the equation for brevity. The quantity that is minimized may be a weighted sum of squares of the residual. Using two gratings with different offset biases doubles the number of measurements without adding any unknown parameters over what is used in the basic approach described in FIGS. 1A and 1B. Therefore, regression applied to measurements at two grating stacks with different offset biases yields a more robust estimate of the overlay. The offset in the y-direction, Δy, is found by a similar but separate regression applied to the measurements at grating stacks 202Y and 202Y'.

Another prior art (Huang et al., "Scatterometry-Based Overlay Metrology," Proc. SPIE Vol. 5038, p126–137, SPIE Bellingham, Wash., 2003) uses a simple algorithm, called linear differential estimation, to obtain overlay from the measurements at 202X and 202X'. When overlay is zero, these targets appear identical to a normal-incidence unpolarized reflectometer because 202X' is identical to 202X rotated by 180° in the plane of the wafer. An unpolarized, normal-incidence reflectometer is insensitive to the angular orientation of the target in the plane of the wafer. When the overlay is nonzero, the reflection symmetry is broken and the optical properties of stacked gratings 202X and 202X' differ (assuming nonzero offset bias). Stacked grating 202X at overlay=+Δx has reflection-symmetry with stacked grating 202X' at overlay=−Δx:

$$R(\lambda, \Delta x, at(202X)) = R(\lambda, -\Delta x, at(202X'))$$ Eq. 2

In Eq. 2, R ($\lambda$, $\Delta x$, at (202x')) is the reflectance spectrum of stacked grating 202X' when the value of overlay is $\Delta x$. When the overlay is small, the difference between the optical properties of the stacked gratings is proportional to the overlay:

$$\begin{aligned}\Delta R &= R(\lambda, \Delta x, \text{at}(202X)) - R(\lambda, \Delta x, \text{at}(202X')) \quad \text{Eq. 3}\\ &= R(\lambda, \Delta x, \text{at}(202X)) - R(\lambda, -\Delta x, \text{at}(202X))\\ &\cong 2 \frac{\partial R(\lambda, \Delta x, \text{at}(202X))}{\partial(\Delta x)} \Delta x\end{aligned}$$

Maximum likelihood estimate of $\Delta x$ based on the linear model (Eq. 3) yields a linear estimator for $\Delta x$ of:

$$\begin{aligned}\Delta x_{est} &= L^T \Delta R_{measured} \quad \text{Eq. 4}\\ &= \sum_\lambda L(\lambda)[R(\lambda, \Delta x, \text{at}(202X)) - R(\lambda, \Delta x, \text{at}(202X'))]\end{aligned}$$

The spectrum $L(\lambda)$ called the estimator, is obtained before measurements are made. $L(\lambda)$ is obtained from either measured or calculated differential optical responses ($\Delta R$) of the grating stacks 202X and 202X'. $L(\lambda)$ is preferably obtained from measurements on multiple pairs of grating stacks 202X and 202X', each with a different known offset written to the reticle. $L(\lambda)$ is then obtained by solving a linear least squares problem.

Prior Art: Disadvantage of Obtaning Overlay by Fitting the Measurement with a Rigorous Model of Diffraction The approach described by Eq. 1 (fitting the optical response of grating stacks by a rigorous model of electromagnetic wave scattering) presents a practical difficulty. The optical index of refraction, a complex number, must be known at all measurement wavelengths for all materials that make up the metrology target. Optical properties of materials are typically measured on uniform film samples that are incrementally deposited on blank wafers. Preparing such samples and measuring their refractive indices as a function of wavelength is time consuming. The optical properties of some blanket films can differ from the properties of the same materials deposited during the actual manufacturing process.

A second difficulty is that the geometric model of the profiles of the lower and upper gratings may fail to represent the actual sample. The geometric model has adjustable parameters. Varying the adjustable parameters spans a set of profiles. However, the actual profile can be outside the set spanned by varying model parameters if the profile has features that are not anticipated by the user. In that case, recovery involves imaging the cross section of the sample by transmission or reflection scanning electron microscopy (SEM), which is a destructive and time-consuming process.

The parameterization of the geometric model is changed accordingly until the model predicts the optical response of the grating stack.

Determining the optical properties and a proper parameterization of the geometric model is a significant setup effort that needs to be completed before the measurements can start. This is a disadvantage compared to the prior art that is based on processing images of targets such as bar-in-bar targets.

Prior Art: Disadvantages of Obtaining Overlay by Linear Differential Estimation

The linear estimation method described in Eqs. 3–4 has a weakness. The coefficient of the term that is linear in $\Delta x$, namely $2\partial R(\lambda, \Delta x, at(202X))/\partial(\Delta x)$, is not a constant spectrum. It depends on thicknesses of layers and profiles of grating lines. Therefore, $L(\lambda)$ in Equation 4 is valid for a narrow range of process parameters such as layer thicknesses. If the process deviates more than 5% either from batch to batch or across a wafer, then Eq. 4 can give erroneous estimates of overlay.

A second difficulty with the linear differential estimator described in Eq. 3–4 is that obtaining (training) $L(\lambda)$ by actual measurements requires multiple targets, each with a known offset written to the reticle. Providing such targets presents a logistics problem. Multiple pairs of grating stacks take prohibitively large area to provide them at each measurement site. Providing them in one place on the wafer may not sufficiently address thickness and line width variations on a wafer and reduces the efficiency of the lithography process. Providing them on a sacrificial wafer does not address wafer-to-wafer variations and reduces the efficiency of production.

Prior Art: Disadvantage of Large Measurement Time and Footprint of Target

Spectroscopic reflectometers and ellipsometers have relatively small (on the order of 0.1) numerical apertures. Otherwise, spectral features of the sample would loose their contrast and sharpness. Consequently, the measurements spot, i.e., spatial resolution, of such instruments is on the order of 40 μm. Therefore, each of the grating stacks 202X, 202X', 202Y, and 202Y' in FIG. 2 must have at least a 40 μm by 40 μm footprint on the wafer. A spectroscopic ellipsometer or reflectometer would have to measure grating stacks 202X, 202X', 202Y, and 202Y' sequentially. Therefore, the scatterometry-based prior art requires at least four times more area on the wafer and four times more measurement time compared to the imaging-based prior art.

Prior Art: The Color-Box Technique

Heimann ("The Color-Box alignment vernier: a sensitive lithographic alignment vernier read at low magnification," Optical Engineering, July 1990, Vol. 29, No. 7, p. 828–836) describes an overlay metrology target that consists of a total of 26 grating stacks (13 grating stacks for each of x and y directions), Heimann used triply redundant grating stacks, (a total of 78) each grating stack occupying a 20 μm by 20 μm area on the wafer. Each grating stack has a different offset written to the reticle, changing in increments of Pitch/16. A low-magnification (5×) microscope objective is used to image the grating stacks without resolving the grating lines. Each grating stack appears to have a uniform color, hence Heimann calls the grating stacks color boxes. The color depends on the offset between the upper and lower gratings in the stack. Overlay is determined by finding the color box around which the colors of the neighboring boxes are symmetrically distributed. This technique does not involve any diffraction computation and offers large depth of focus. The optics required for the color-box measurement are of lower cost and more robust compared to the optics required for the imaging-based prior art that uses bar-in-bar targets.

SUMMARY OF THE INVENTION

An embodiment of the present invention includes an overlay target and an associated measurement instrument. The overlay target consists of multiple grating stacks, typically more than four for each of the x and y directions. Each grating stack has a different offset built into the reticle. The measurement instrument is an imaging spectrometer that captures all grating stacks in one overlay target in the field of view simultaneously. The imaging optics resolves the grating stacks but it does not resolve the unit cells of the gratings. This makes the measurement immune to lens aberrations, vibration, and focus dependency that complicates imaging-based prior art. The measurement offers ease of use and minimal preparation because it does not require computation of electromagnetic wave scattering; hence, it does not require knowledge of optical properties of the materials or the cross section profiles of the grating structures. The measurement is tolerant to changes in the thickness of layers or width of grating lines. The objects of this invention are to provide:

1) An imaging spectrometer to measure overlay of two patterned layers and a metrology target that is built into the said patterned layers 2) Means of increasing the throughput of overlay metrology by measuring multiple grating stacks simultaneously 3) Means of reducing the size of the metrology target so that one or two targets fit side by side in a scribe line between dies of semiconductor devices on a wafer 4) An algorithm that processes images taken at one or more wavelengths and/or angles to obtain overlay 5) Means of measuring overlay with high tolerance to focus errors, vibration, and processes variations

BRIEF DESCRIPTION OF THE DRAWINGS

FIG. 2A is a top view of a prior art overlay target.

FIG. 2B is cross sectional view of the prior art overlay target of FIG. 2A.

DETAILED DESCRIPTION OF THE PREFERRED EMBODIMENTS

Metrology Target

Figure 1A:
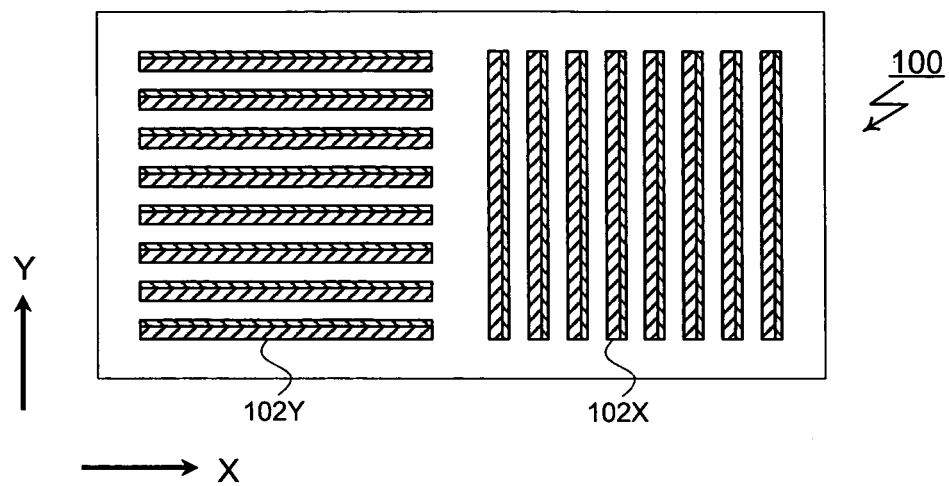
FIG. 1A is a top view of a prior art overlay target.
Figure 1B:
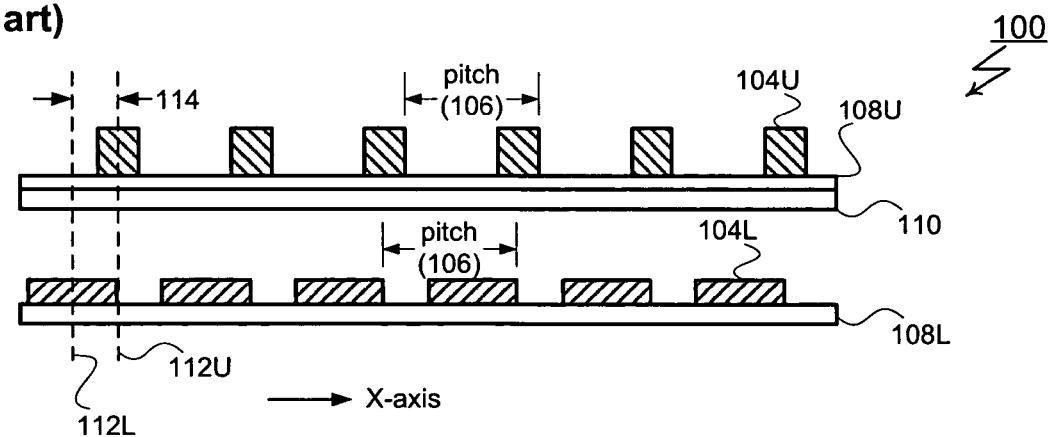
FIG. 1B is cross sectional view of the prior art overlay target of FIG. 1A.

The symbol $R(\lambda,\theta,\xi)$ denotes the optical response of the grating stack as a function of wavelength $\lambda$, angle of incidence $\theta$, and $\xi$ which denotes offset 114 in FIG. 1B. The optical response could be polarized or unpolarized reflectance or ellipsometric parameters $\psi$ and $\Delta$, or Fourier coefficients of intensity measured by a rotating polarizer or rotating compensator ellipsometer. Optical response $R(\lambda,\theta,\xi)$ has the following properties:

$$R(\lambda,\theta,\xi)=R(\lambda,\theta,\xi+\text{Pitch}) \quad \text{Eq. 5a}$$

$$R(\lambda, \theta,+\epsilon)=R(\lambda, \theta,-\epsilon) \quad \text{Eq. 5b}$$

$$R(\lambda, \theta,(\text{Pitch}/2)+\epsilon)=R(\lambda, \theta,(\text{Pitch}/2)-\epsilon) \quad \text{Eq. 5c}$$

Figure 3A:
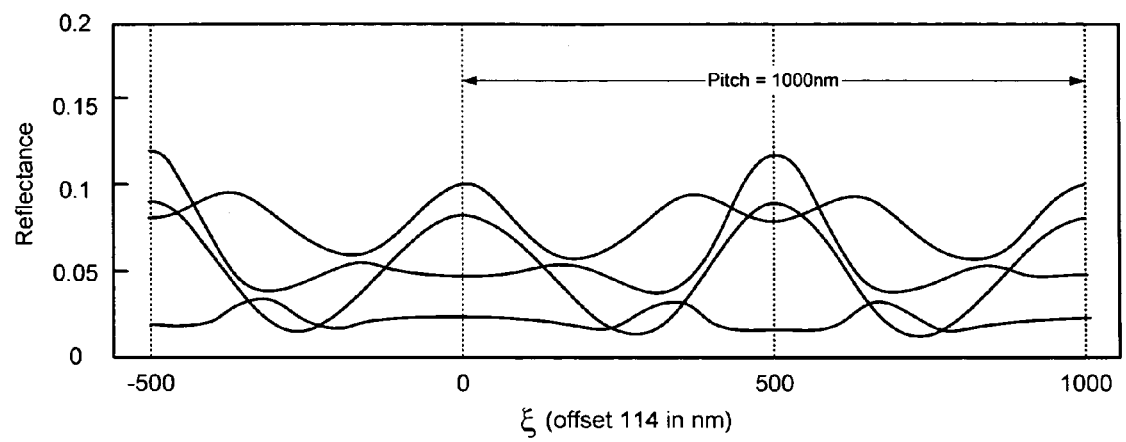
FIG. 3a shows the computed reflectance spectra of a grating stack such as 102X as a function of the offset 114, for four wavelengths.
Figure 3B:
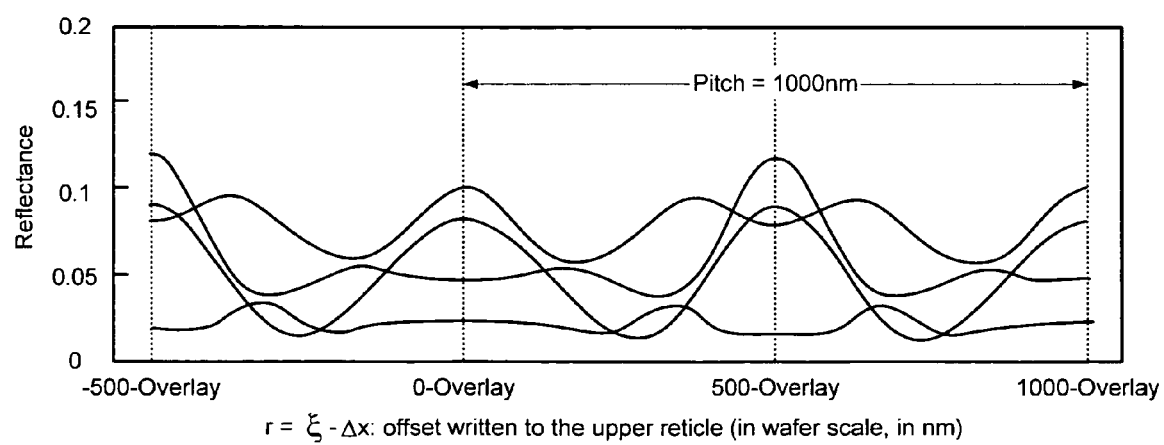
FIG. 3b shows the computed reflectance spectra of a grating stack such as 102X at four wavelengths as a function of an offset intentionally written to the reticle.

Eq. 5a follows from the periodicity of the gratings. Because of reciprocity theorem of Helmholtz and symmetry of the grating lines, Eq. 5b and 5c hold for arbitrary offset $\epsilon$ and arbitrary angle of incidence $\theta$. Eq. 5b follows from the symmetry of the grating stack when the centerlines of the lower and upper grating lines are aligned. Eq. 5c follows from the symmetry of the grating stack when the centerlines of the lower grating lines align with the centerlines of the spaces of the upper grating. FIG. 3a shows the calculated reflectance, $R(\lambda,\theta,\xi)$, of a grating stack such as 102X as a function of $\xi$ (offset 114) for four wavelengths at normal incidence. FIG. 3a illustrates the three properties described in Eq. 5: $R(\lambda,\theta,\xi)$ and $R(\lambda,\theta,\xi-(\text{Pitch}/2))$ are even functions of $\xi$ for every wavelength. This property can be used to measure overlay. Suppose multiple copies of grating stack 102X are provided such that each one has a different offset 114 intentionally written to the reticle. In this document that offset (i.e., the amount of offset intentionally written to the reticle for a grating stack) is denoted r. It follows that the total offset $\xi$ of any given grating stack 102x is the sum of the intentional offset r and the unintentional offset $\Delta x$ (i.e., the overlay to be measured). More formally, this may be written as: ξ+Δx. FIG. 3B shows how reflectance varies as a function of intentional offset r=ξ−Δx. For the case where ξ is zero:

$$\Delta x = -r \qquad \text{Eq. 6}$$

This means that overlay may be measured by locating the grating stack that has a total offset ξ equal to zero. Fortunately, the optical properties described by Eq. 5 mean the desired grating stack is located at a point of symmetry. Increasing or decreasing r by the same amount changes the optical response in the exact same way. For example, the gratings stack with the next largest r (when compared to the grating stack that has a total offset ξ equal to zero) has the same optical response as the grating stack with the next smallest r. This continues for increasing (and symmetrically decreasing) values of r. The symmetry point ξ equal to zero can be identified up to an arbitrary integer multiple of Pitch/2.

Figure 4:
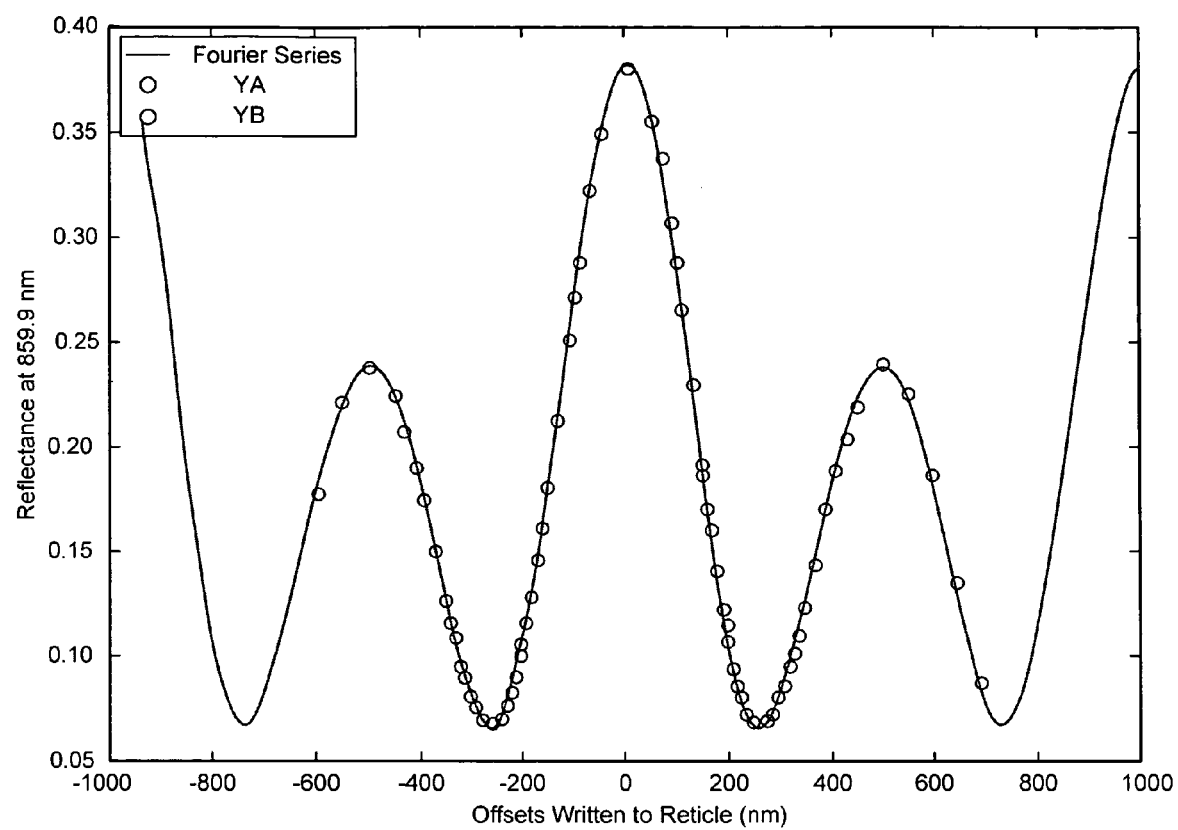
FIG. 4 shows actual measurements of reflectance of a grating stack such as 102X at a wavelength of 859.9 nm as a function of offsets intentionally written to the reticle.

FIG. 4 shows experimental confirmation of the properties in Eq. 5. The dot-markers in FIG. 4 show actual measurements of reflectance of a grating stack at normal incidence at a wavelength of 859.9 nm. The grating stack (Pitch=1000 nm) is for the overlay metrology of contact mask to shallow trench. The overlay was −4 nm in this example.

Figure 5A:
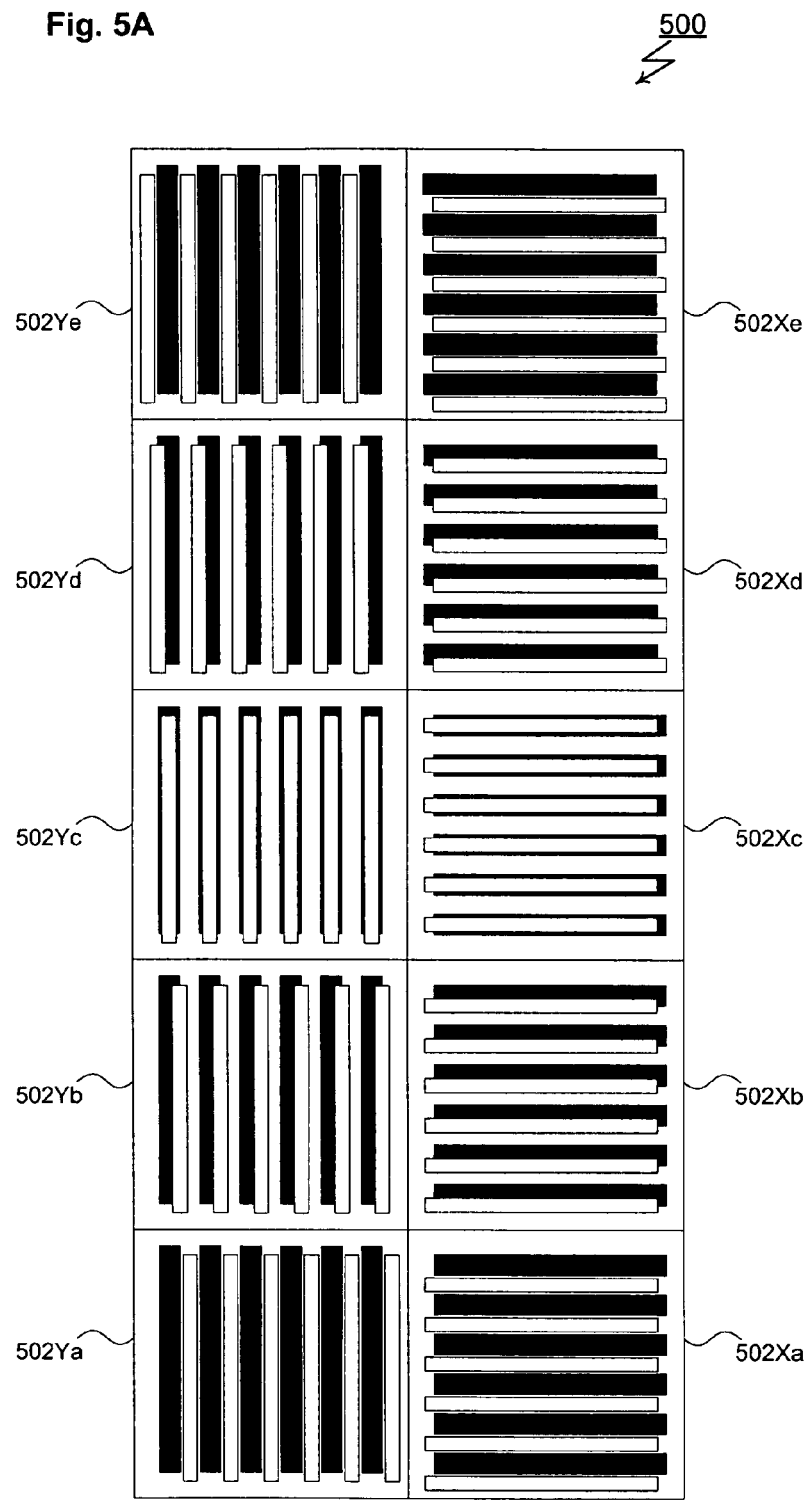
FIG. 5a shows top view of overlay target according to the present invention.

The overlay target 500 according to the present invention is shown in top view in FIG. 5a. The overlay target 500 comprises a multitude of grating stacks. Grating stacks 502Xa, 502Xb . . . 502Xe are used together to measure the x-component of overlay. Grating stacks 502Ya, 502Yb . . . 502Ye are used together to measure the y-component of overlay. The footprint of each grating stack in the wafer plane is typically 10 μm by 10 μm. Each grating stack 502X has a different offset (r) written to the reticle as shown in cross section in FIG. 5b. The offsets that are written to the reticle are preferably selected as follows:

$$r_k = -\frac{P}{2} - \frac{P}{2N_r} + \frac{kP}{N_r}; k = 1, 2, \ldots, N_r \qquad \text{Eq. 7}$$

Figure 5B:
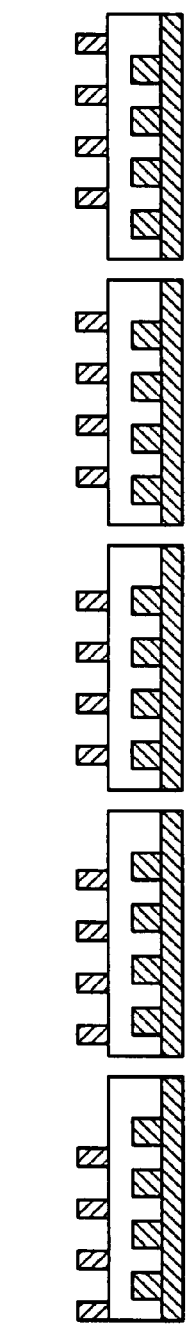
FIG. 5b shows cross section view of overlay target according to the present invention.

$N_r$ is the number of grating stacks per target for each of the x and y directions (total of 2 $N_r$ grating stacks per overlay target). Although FIGS. 5a and 5b show five grating stacks per direction for clarity ($N_r$=5), the typical value of $N_r$ is eight. Many selections of equally spaced reticle offsets other than the one in Eq. 7 are possible. Non-uniform spacing of reticle offsets is also possible but not preferred.

Figure 6:
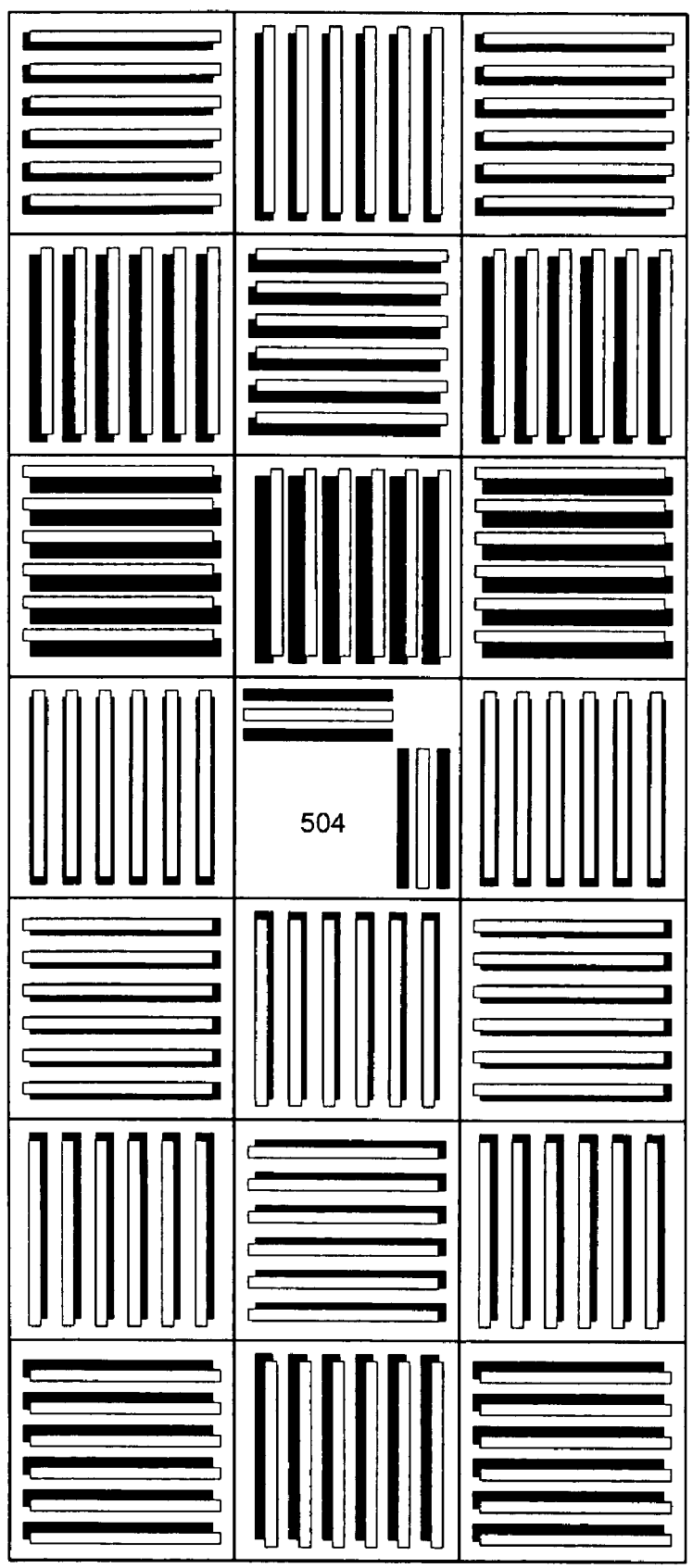
FIG. 6 shows the top view of overlay target according to a preferred embodiment of the present invention.

Grating stacks 502 are placed close to each other so that they have the same layer thicknesses and line widths and overlay. Otherwise, they can be arranged in any fashion in the scribe line, for example, as shown in FIG. 6. Placing grating stacks so that their reticle offsets are not in a uniform progression with respect to their position offers an advantage: gradual variations in a film thickness or linewidth are not confused with overlay. Alternating x and y-measuring gratings in a checkerboard pattern as shown in FIG. 6 offers another advantage: In the case of grossly large overlay (larger than half pitch), the horizontal and vertical lines overlap creating a zone of distinct optical properties. Presence of this condition and the width of the region of overlap can be determined from images of the overlay metrology target. The overlay target 500 shown in FIG. 6 includes a bar-in-bar feature 504. The bar-in-bar feature 504 enables a gross overlay reading by image processing. The gross-overlay measurement is useful when overlay exceeds the measurement range (±Pitch/4) of the grating stacks.

Figure 7:
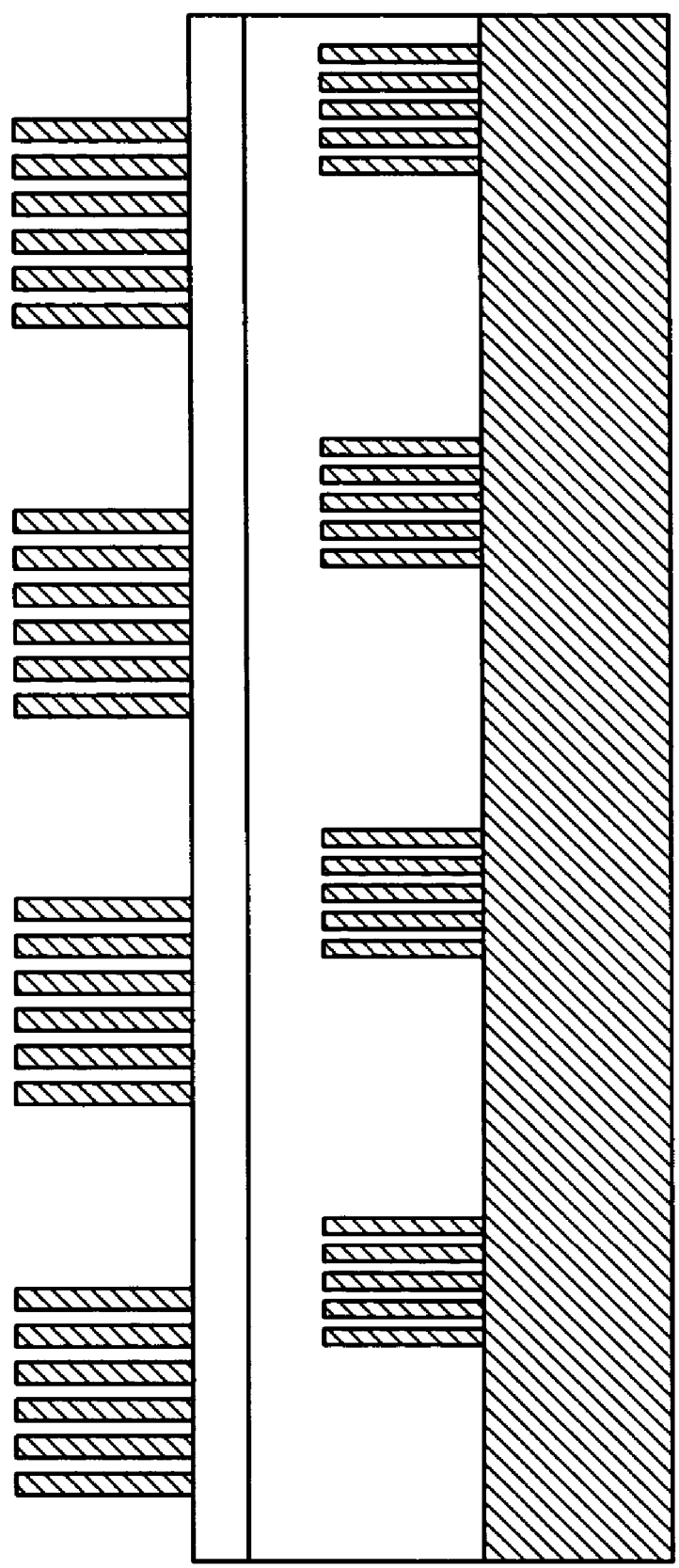
FIG. 7 shows cross section view of overlay target according to an embodiment of the present invention where grating lines are further segmented into lines at critical dimension.

At least one non-zero diffracted order must be propagating in the layers between the gratings for the images to contain information about overlay. Overlay can still be discerned if the gratings interact by evanescent waves, but the range of parameters in which that happens is narrow. Therefore, $$\text{Pitch} \geq \lambda/(n+\sin(\theta)) \qquad \text{Eq. 8}$$

is preferred. In Eq. 8, n is the smallest index of refraction of layers (e.g., 110 of FIG. 1B) between the lower and upper gratings. As the critical dimension (line width or contact hole diameter) shrinks with advancements in semiconductor manufacturing, there is a need to shrink the features of the overlay metrology targets. The reasons for this are: aberrations of the lithography projection lens depend on pitch. Therefore, overlay metrology targets and device features must have similar pitches. Secondly, chemical mechanical planarization (CMP) causes artifacts that depend on feature density and line width. If devices and metrology targets have similar densities and line widths, the CMP process can be optimized more efficiently (One exception to this occurs when an opaque layer separates the upper and lower gratings. In that case CMP artifacts may be intentionally enhanced to transfer the topography of the lower grating to the surface of the opaque layer.) Making the pitch of the overlay targets the same as the pitch of devices may violate Eq. 8. In that case, grating lines can be segmented into finer (at the critical dimension) lines that are parallel or perpendicular to the grating lines. Alternatively, grating lines can be segmented into contact holes or other 2-dimensional array of features at critical dimension (CD). FIG. 7 shows, in cross section, the upper grating lines segmented into six fine lines and the lower grating lines segmented into five fine lines at CD. The width of the fine lines is the same as the lines that make up the semiconductor devices on the wafer. Since the measurement range is Pitch/2, increasing the pitch offers a larger measurement range albeit at a reduced sensitivity to overlay. Segmenting the grating lines allows a larger measurement range while keeping the smallest features similar to that of the devices.

Alternatively, the pitch of the overlay targets can be close to that of the devices and Eq. 8 can be satisfied by making overlay measurements at shorter wavelengths or oblique incidence or both. For example, if the pitch is 100 nm, and refractive index n=1.47, angle of incidence θ=65°, then measurement wavelength should be no greater than 237 nm. Light at this ultraviolet wavelength can be generated by, for example, a deuterium discharge lamp.

Measurement Instrument

The apparatus is an imaging spectrometer. It resolves the reflection from the wafer in the x-y plane of the wafer and in wavelength. In other words, the target is imaged at several wavelengths, either sequentially or simultaneously. The embodiment shown in FIG. 8 acquires images at different wavelengths sequentially. This embodiment is preferred for its simplicity. Light from a broadband source 802 is collected and collimated by optics 804. Iris 806 controls the numerical aperture of illumination. Filter 808 is placed preferably in the collimated illumination path to select the wavelength of illumination. Filter 808 is preferably a bandpass interference filter with a bandwidth on the order of 10 nm. Other filters such as long-pass filters are also possible. Filter 808 is mounted on a filter wheel that supports a multitude of filters with different pass bands. A motor 810 rotates the filter wheel under the control of controller-processor 812. Light from the filter wheel 808 is directed by beam splitter 814 and focused by an objective 816 onto a sample 818. Sample 818 includes an overlay target of the type described above. The entire overlay target is illuminated by the beam from objective 816. The size of the illuminated spot on sample 818 is controlled by a field stop or a pinhole (not shown) in the illumination optics at a plane that is conjugate to the wafer. Iris 820 determines the numerical aperture of the reflected light collected by objective 816. Light collected by objective 816 is imaged onto a detector array 822 by re-imager 824. Optical elements 804, 816 and 824 are schematically shown as single lenses in FIG. 8, but in practice they are compound reflective or refractive elements. The output of detector array 822 representing the image of the overlay target in sample 818 is digitized at digitizer 826 and transmitted to controller-processor 812. An algorithm that runs on controller-processor 812 processes the digitized image and returns overlay ($\Delta$x, $\Delta$y). Pupils 806 and 820 are selected so that the unit cells of gratings, which are typically sub-micron features, are not resolved. Each grating appears as a box of uniform color in the image. The resolution is high enough to distinguish reflections from the various grating stacks included in the overlay target (e.g., see 502Xa, 502Xb, and so on in FIG. 5A). The grating stacks are typically 10 $\mu$m×10 $\mu$m. Microscope objectives with numerical aperture (NA) larger than 0.5 resolve 10 $\mu$m×10 $\mu$m features at visible wavelengths. It is highly desirable to limit the NA of illumination with a separate aperture 806, typically to less than 0.1, for two reasons: Spectral (color) contrast between grating stacks of different offsets is maximized by reducing the NA. Since the collection NA needs to be large enough to resolve grating stacks, the spectral contrast is ensured by reducing the NA of illumination. The second benefit of a small illumination aperture is reduced cross talk between adjacent grating stacks. The image of a grating stack has a diffraction tail in the image plane that extends beyond the bounds of the grating stack. The diffraction tails fall off faster when illumination NA is smaller than the collection NA.

The intensity of the illumination at each setting of the filter wheel 808 is measured by a photo-detector 828. Detector array 822 and photo-detector 828 collect photons over the same time interval. Alternatively, photo-detector 828 can be some of the elements in the detector array 822 and the illumination can be imaged onto these elements by mirrors and optics not shown in FIG. 8. The exposure (integration) time is preferably different for each setting of the filter 808. t the wavelengths where the light source is weaker or the detector has smaller quantum efficiency, the integration time can be longer.

Alternative Embodiments

Figure 8:
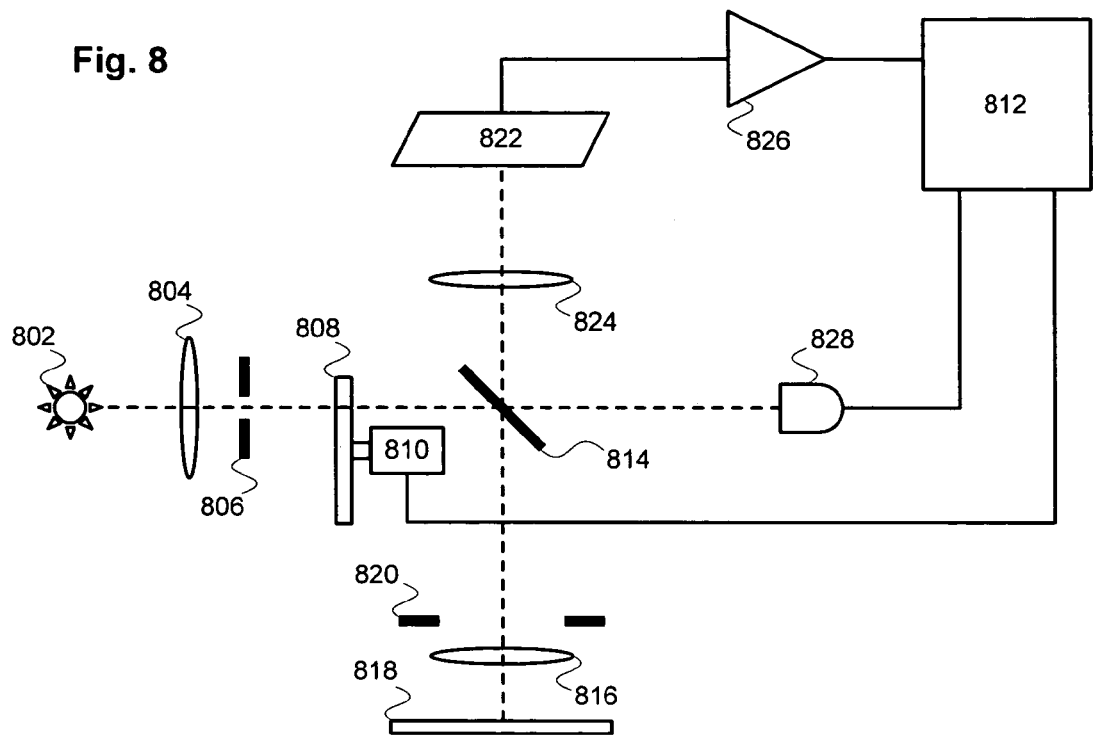
FIG. 8 is a schematic diagram of a spectromicroscope that selects the illumination wavelength using a filter wheel.

Many variants of the preferred embodiment are possible. Referring to FIG. 8, the filter wheel 808 can be inserted in the detection path, between beam splitter 814 and re-imager 824. Another way to change the pass band of the filter is to tilt the filter. Alternatively, filter 808 is electronically tunable with no moving parts. Electronically tunable filters may be obtained, for example by CRI Instruments, Woburn, Mass.

Figure 9:
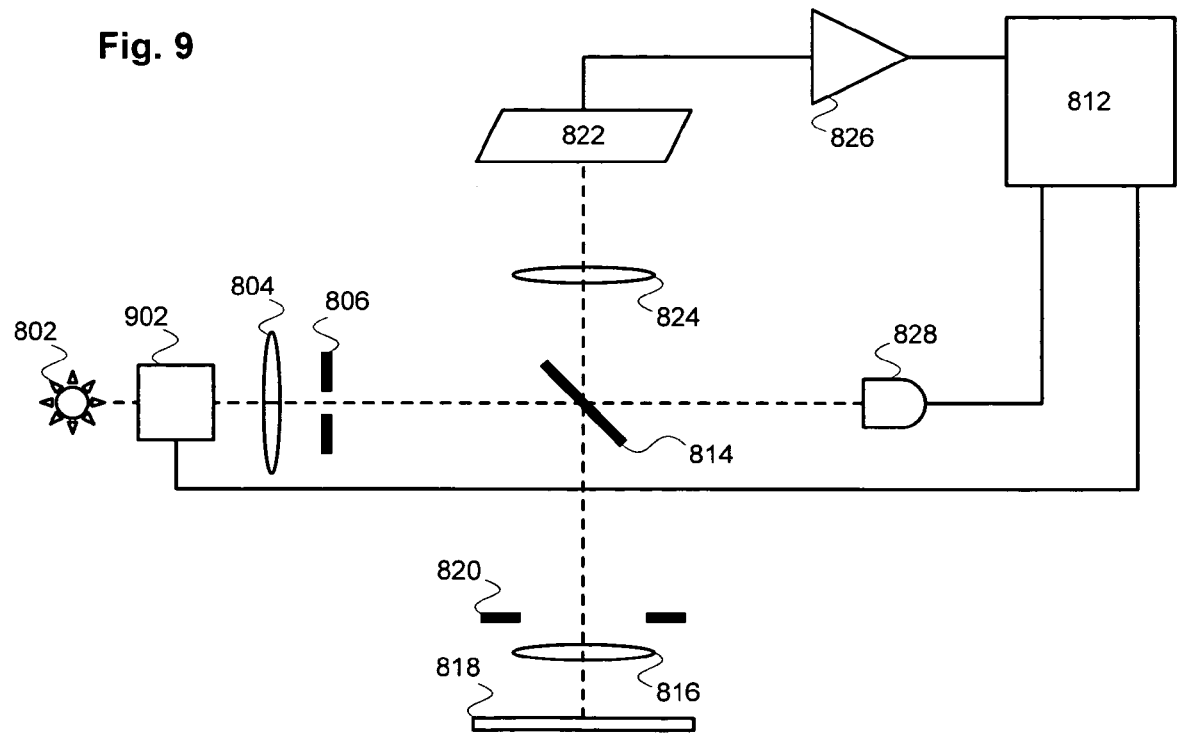
FIG. 9 is a schematic diagram of a spectromicroscope that selects the illumination wavelength using a monochromator.

Alternatively, as shown in FIG. 9, a monochromator 902 can be used to control the output of illumination source 802. The grating of the monochromator is scanned under the control of the controller-processor 812. Monochromators for spectromicroscopy are supplied, for example, by Acton Research Co., Acton, Mass.

Figure 10:
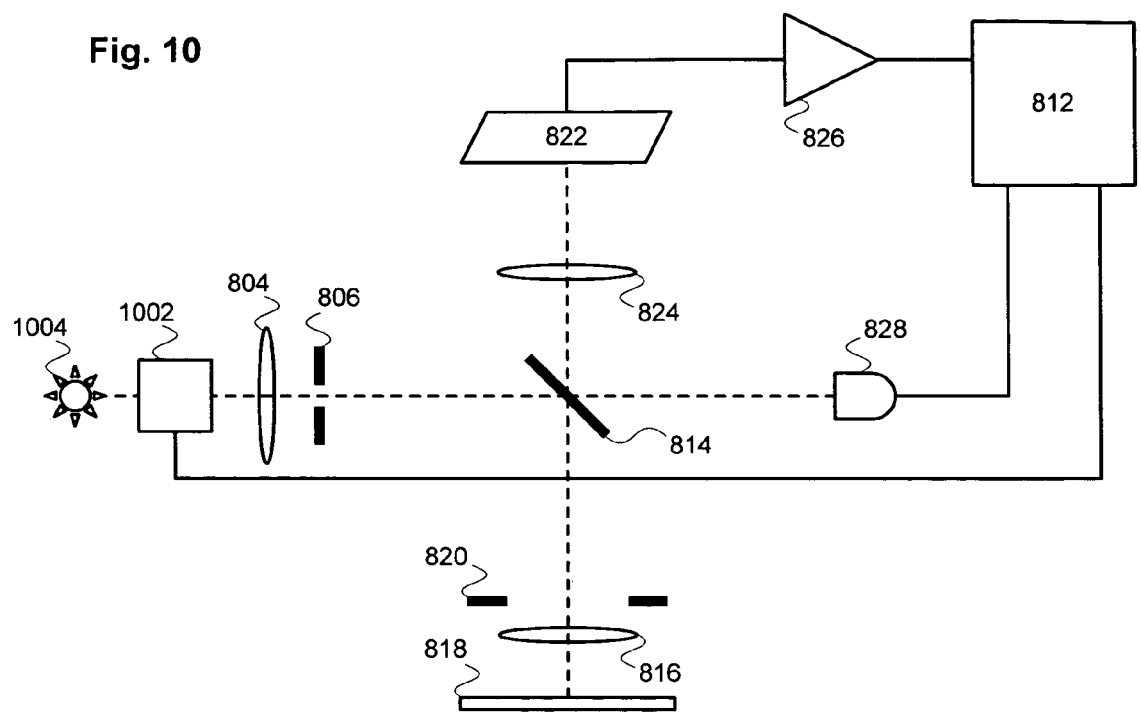
FIG. 10 is a schematic diagram of a spectromicroscope that uses a tunable optical parametric oscillator as a light source.

Referring to FIG. 10, another alternative is to use a tunable optical parametric oscillator (OPO) 1002 pumped by a high-intensity pulsed laser 1004 as the light source. Such broadband tunable lasers are supplied by OPOTEK, Inc., Carlsbad, Calif. The output wavelength of the OPO is tuned by changing the orientation of a nonlinear crystal by a motor or actuator, which in turn is controlled by the controller-processor 812.

Another alternative is to measure the optical responses of the grating stacks within the overlay target one at a time using a non-imaging reflectometer or ellipsometer that has a small measurement spot. The measurement can be made as a function of wavelength or angle of incidence or azimuth. Azimuth angle is the angle between the plane of incidence and a line on the plane of the sample. Disadvantages of this approach are the relatively long move-and-measure time required to measure grating stacks sequentially; and the relatively large footprint of the metrology target.

Alternative Embodiment

Imaging Fourier Transform Spectroreflectometer

Figure 11:
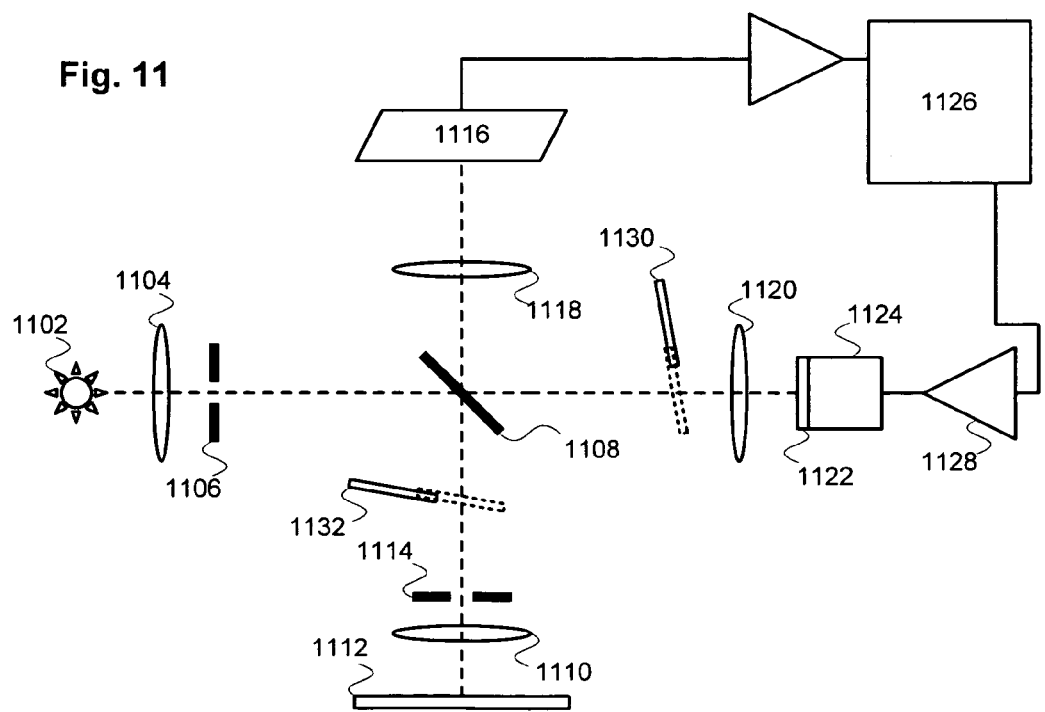
FIG. 11 is a schematic diagram of an imaging Fourier transform spectrometer.

Embodiments schematically shown in FIGS. 8, 9, 10 image the overlay target at different wavelengths, one wavelength at a time. Approaches of FIGS. 8 and 9 lead to simple instruments but they do not use the measurement time efficiently because they reject most available photons. The embodiment schematically shown in FIG. 11 acquires images at all wavelengths simultaneously using the Fourier transform spectrometer method, which is commonly used in Fourier transform infrared spectroscopy (FTIR). The wavelength range in this embodiment is not limited to the infrared. It can be UV to NIR. The advantage of this technique is that none of the photons from the white light source 1102 are rejected during signal acquisition, leading to a shorter measurement time. Referring to FIG. 11, the broadband light source 1102 can be a xenon or deuterium discharge lamp, or a tungsten lamp, or any combination of these light sources. Light from the broadband light source 1102 is collected and collimated by optics 1104. Pupil 1106 limits the angle of incidence of illumination to typically less than NA=0.1. The illumination partially reflects off beam splitter 1108 toward objective 1110 and on to the sample 1112. An overlay target on sample 1112 is uniformly illuminated. The light that reflects from sample 1112 is collected by objective 1110. Pupil 1114, which is in the back aperture plane of objective 1110 determines the numerical aperture of collection. Typically, this numerical aperture is greater than 0.5 in order to resolve the grating stacks and minimize the cross talk between the adjacent grating stacks. Since resolving the grating lines is to be avoided, a large numerical aperture such as 0.9 is not necessarily beneficial. The collected light passes through beam splitter 1108. The light reflected from the wafer is imaged onto the detector array 1116 by the combination of objective 1110 and re-imager 1118. Detector 1116 is a two dimensional (x,y) array, such as a charge coupled device (CCD). A portion of the light from source 1102, known as the reference beam, passes through beam splitter 1108, optional objective 1120, reflects off mirror 1122, reverses its path through objective 1120, reflects off beam splitter 1108, and is imaged by re-imager 1118 onto the detector 1116. The reference beam and the test beam mix and interfere at the detector 1116. The phase of the reference beam is changed by changing the position $\Delta$u of mirror 1122 by actuator 1124. Actuator 1124, for example, can be a piezoelectric actuator controlled by a controller-processor 1126 via driver 1128. The total electric field at the pixel (x,y) at the wavenumber k is:

$$E_{TOTAL}(x,y,k,\Delta u) = E_0(x,y,k)R(x,y,k) + E_{REF}(x,y,k)e^{ik\Delta u} \quad \text{Eq. 21}$$

R(x,y,k,) in this context is the complex reflectance of the specimen at the point (x,y) on the wafer at wavenumber k=2π/λ where λ is the wavelength. The dependence of the reflectance on the angle of incidence is ignored in this discussion. The intensity at the pixel, where point (x,y) on the wafer is imaged, is:

$$I(x, y, \Delta u) = \int_0^\infty |E_0(x, y, k)R(x, y, k)^2| dk + \quad \text{Eq. 22a}$$

$$\int_0^\infty |E_{REF}(x, y, k)|^2 dk +$$

$$\int_{-\infty}^\infty F(x, y, k)\exp(ik\Delta u)dk$$

$$F(x, y, k) = \begin{cases} E_{REF}(x, y, k)[E_0(, xy, k)R(x, y, k)]^* & \text{for } k > 0 \\ E^*_{REF}(x, y, -k)E_0(x, y, -k)R(x, y, -k) & \text{for } k < 0 \end{cases} \quad \text{Eq. 22b}$$

The symbol (.)* denotes complex conjugation. When shutter 1130 is closed, the reference beam is blocked from reaching the detector. In that case, the detected intensity is:

$$I_{470}(x,y) = \int |E_0(x,y,k)R(x,y,k)|^2 dk \quad \text{Eq. 23}$$

When shutter 1132 is closed, the test beam is blocked from reaching the detector, resulting in the detected intensity:

$$I_{440}(x,y) = \int |E_{REF}(x,y,k)|^2 dk \quad \text{Eq. 24}$$

Taking the difference of these measurements, one obtains the Fourier transform of the spectrum:

$$I(x, y, \Delta u) - I_{470}(x, y) - I_{440}(x, y) + I_{DARK}(x, y) = \quad \text{Eq. 25}$$

$$\int_{-\infty}^\infty F(x, y, k)\exp(ik\Delta u)dk$$

The dark background of the detector cancels out in the equation above. The dark background $I_{DARK}(x,y)$ is measured by blocking the light source 1102 by a shutter (not shown). Taking the inverse Fourier transform of Eq. 25, we obtain:

$$|F(x, y, k)| = \quad \text{Eq. 26a}$$

$$\frac{1}{2}\left|\int_{-\infty}^\infty [I(x, y, \Delta u) - I_{70}(x, y) - I_{40}(x, y) + I_{DARK}(x, y)]\right.$$

$$\left. e^{-ik\Delta u}d(\Delta u)\right|$$

$$|F(x, y, k)| = \quad \text{Eq. 26b}$$

$$\begin{cases} |E_{REF}(x, y, k)E_0(x, y, k)R(x, y, k)| & \text{for } k > 0 \\ |E_{REF}(x, y, -k)E_0(x, y, -k)R(x, y, -k)| & \text{for } k < 0 \end{cases}$$

Eq. 26 yields the reflectance of the specimen resolved in position on the wafer and wavelength. The right hand side of Eq. 26b contains terms that depend on the light source and optical efficiency of light paths, namely, $|E_{REF}(x,y,k)E_0(x,y,k)|$. These terms are calibrated by measuring at least one wafer with a known reflectance. A bare silicon wafer and a thermal oxide film over a silicon wafer are suitable calibration wafers. Leveling of the wafer is not critical because height errors z(x,y) are cancelled:

$$|E_{REF}(x,y,k)E_0(x,y,k)R(x,y,k)| = |E_{REF}(x,y,k)E_0(x,y,k)R(x,y,k)e^{2ikz(x,y)}| \quad \text{Eq. 27}$$

The interferometer configuration in FIG. 11, similar to the Linnik microscope, is not the only implementation. A Mirau interferometer can also be used. In a Mirau interferometer, the test beam and the reference beam share one common objective. The two beams are split by a partially reflecting plate that is placed between the objective and the specimen. The phase of the reference path is modulated by moving the partially reflecting plate in the direction of the optic axis.

Alternative Off-Axis and Dark Field Embodiments

Figure 12:
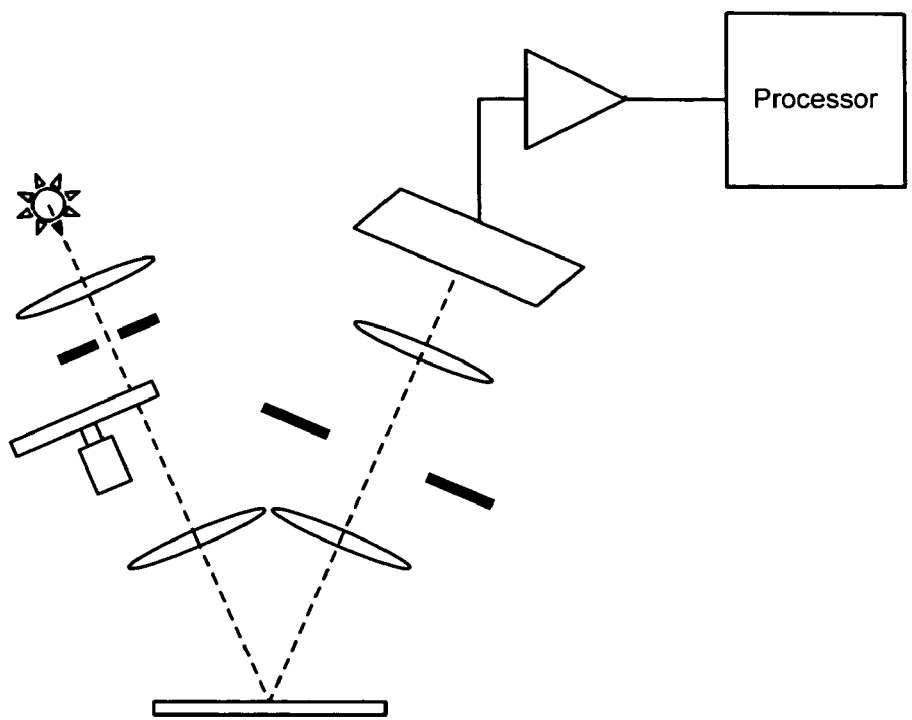
FIG. 12 is a schematic diagram of an off-axis spectromicroscope.

In the embodiment shown in FIGS. 8, 9, 10, and 11 reflections from the rear elements of the objective fall on the detector array creating flare across the image of the overlay target. Because flare causes chromatic and spatial variation across the image, it must to be subtracted from the image before calculating overlay. Flare can be recorded using a nonreflecting sample and subtracted from subsequent images. In addition, multiple reflections between the detector array and the sample can create ghost images, which are not easily compensated because they depend on the specimen. Flare and ghost reflections are reduced by making the measurement off axis as schematically shown in FIG. 12. Due to Helmholtz—reciprocity theorem, symmetry properties of Eq. 5 hold when the measurement is made off axis. Therefore, the measurement based on grating stacks works the same way irrespective of the angle of incidence, provided the entire overlay target is within the depth of field. However, the measurement of gross overlay using bar-in-bar marks (e.g., 504 in FIG. 6) is not easily done off axis because of the parallax between the bars on the upper and lower layers.

In an alternative embodiment, the incidence angle θ and the collection angle θ in FIG. 12 are changed in lock step and images are acquired at different values of θ, as in the 2-theta method in scatterometry. Images of the overlay target can be acquired at different wavelengths, or angles of incidence, or azimuth angle, or polarization state of illumination or detection, or any combination of these independent variables. Azimuth angle is the angle between the plane of incidence and a line in the plane of the overlay target.

Figure 13:
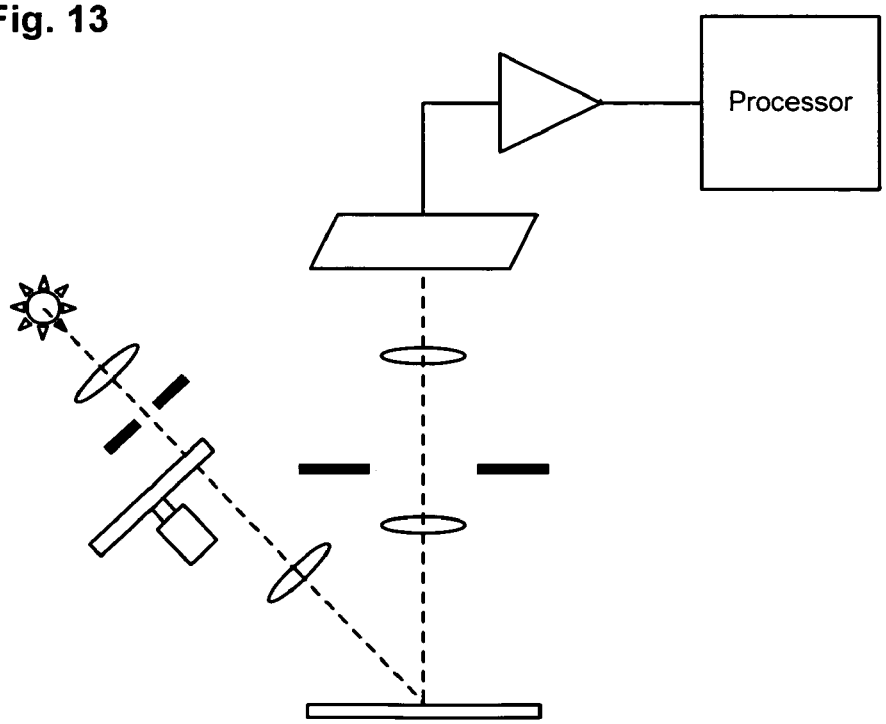
FIG. 13 is a schematic diagram of an off-axis, dark-field spectromicroscope.

All embodiments can be modified to acquire dark-field images, or both bright-field and dark-field images. Dark-field images are formed by rejecting the specular reflection and imaging the scattered light. The embodiment in FIG. 12 can be turned into a dark-field imaging system by having the illumination and collection arms at different angles as schematically shown in FIG. 13. The angle of collection must differ from the angle of illumination by more than asin NA(illumination)+asin NA(collection) for the specular reflection to be completely rejected.

Figure 14A:
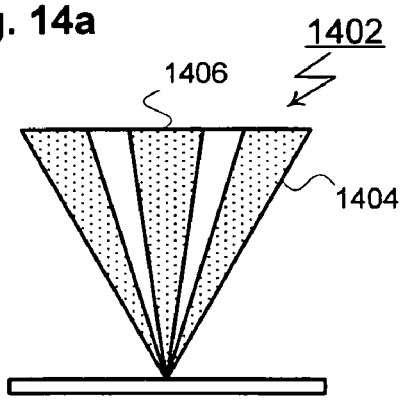
FIG. 14a shows the light paths of a dark field objective where an annular region of the aperture is used for illumination.
Figure 14B:
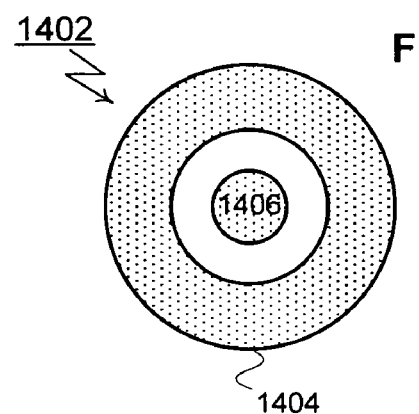
FIG. 14b shows the partition of the aperture of a dark-field objective
Figure 14C:
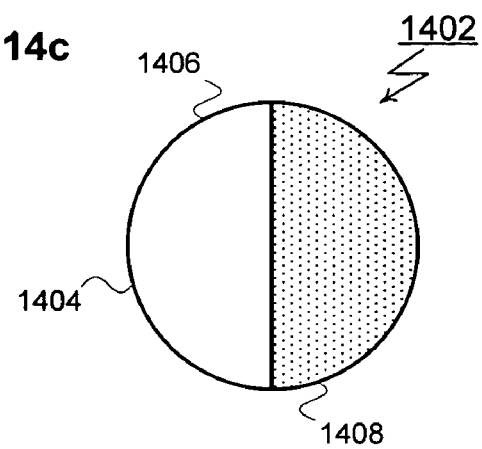
FIG. 14c shows an alternative partition of the aperture of a dark-field objective

Standard technique of dark-field reflection microscopy divides the aperture of the objective into a central circular region and an annular region surrounding the central region. This is schematically shown in FIGS. 14a and 14b. Back aperture plane 1402 of the objective is divided into annular illumination region 1404 and collection region 1406. Stops in the illumination and collection paths are used so that the collection aperture is not illuminated. Illumination and collection apertures in FIG. 14b can be interchanged. A dark field image is produced by any arrangement that divides the aperture 1402 of the objective into two regions, region 1404 for illumination, and region 1406 for collecting the scattered light, such that the transformation of illumination region 1404 under reflection (x,y)→(−x,−y) does not intersect collection region 1406. Another such example is shown in FIG. 14c. Half of the aperture is used for illumination and also collecting scattered light. The specular reflection is rejected by the stop 1408. For the grating stacks not to appear dark in the middle, regions 1404 and 1406 must be selected so that at least one non-zero diffraction order of the gratings must fall in aperture 1402. For the partition of the aperture shown in FIG. 14b, this requires:

$$NA_{MIN}(\text{illumination}) - NA(\text{collection}) < (\lambda/P) < NA_{MAX}(\text{illumination}) + NA(\text{collection}) \quad \text{Eq. 30}$$

$NA_{MIN}(\text{illumination})$ and $NA_{MAX}(\text{illumination})$ correspond to the inner and outer radii of the annular region 1404. Potential advantages of dark-field imaging are lower flare and higher contrast.

Processing of Images

One or more images of the overlay target are acquired at different values of wavelength, or angle of incidence, or azimuth angle, or any combination of these independent variables of measurement. Let $I(x, y, \lambda, \theta)$ denote the image acquired at wavelength $\lambda$ and angle of incidence $\theta$. In this context, x and y are integer indices of pixels that make up the image. The images are first compensated for variations in the sensitivities and offsets of the detector array and spatial variation in the flare according to the following steps:

Step 1: Acquire the Images of the Sample $I^{(S)}(x,y,\lambda,\theta)$ $I^{(S)}(x,y,\lambda,\theta)$ is acquired at one or more values of wavelength $\lambda$ and angle of incidence $\theta$. The superscript (S) refers to the sample.

Step 2: Acquire the Dark Background Image $I_D^{(S)}(X,Y,\lambda,\theta)$

The dark background image $I_D^{(S)}(x,y,\lambda,\theta)$ is acquired with the light source shuttered. Although the dark background image does not directly depend on the wavelength and the angle of incidence, it depends on exposure time. Different exposure times may be used for different wavelengths and angles of incidence. Therefore, $I_D^{(S)}(x,y,\lambda,\theta)$ has the arguments $\lambda$ and $\theta$. This step may be unnecessary if the detector array is cooled, or if the flare subtraction and uniformity compensation are not needed.

Step 3: Monitor the Intensity of the Light Source $I_L^{(S)}(\lambda,\theta)$

This step is needed only if flare subtraction is needed. The intensity of the light source, $I_L^{(S)}(\lambda,\theta)$ is measured by a photo detector after light goes through a filter or monochromator. This can be achieved by diverting some of the illumination on to some of the pixels at the margin of the CCD array.

Step 4: Measure the Flare: $I^{(F)}(x,y,\lambda,\theta)$, $I_D^{(F)}(x,y,\lambda,\theta)$, $I_L^{(F)}(\lambda,\theta)$ Flare is measured with a special, non-reflective sample. Such a calibration tool can be made of an angled black (absorbing) glass. The corresponding dark images, $I_D^{(F)}(x,y,\lambda,\theta)$, and light source intensity, $I_L^{(F)}(\lambda,\theta)$, are recorded. The superscript (F) refers to flare. Flare is also called bright background. Flare is measured when the instrument is calibrated. Although the flare measurement is listed as Step 4, it may be performed months in advance of the sample measurement.

Step 5: Measure the Uniformity: $I^{(U)}(x,y,\lambda,\theta)$, $I_D^{(U)}(X,Y,\lambda,\theta)$, $I_L^{(U)}(\lambda,\theta)$ Uniformity is measured with a sample that is known to be uniform over the field of view. A bare silicon wafer is suitable for this purpose. The corresponding dark images, $I_D^{(U)}(x,y,\lambda,\theta)$, and light source intensity, $I_L^{(U)}(\lambda,\theta)$, are recorded. The superscript (U) refers to the uniformity measurement. The uniformity is measured when the instrument is calibrated. Although the uniformity measurement is listed as Step 5, it may be performed months in advance of the sample measurement.

Step 6. Apply Flare and Uniformity Corrections

Images of the sample are compensated for dark background, flare, and nonuniformity in the following manner:

$$I(x, y, \lambda, \theta) = \{[I^{(S)}(x, y, \lambda, \theta) - I_D^{(S)}(x, y, \lambda, \theta)] / \quad \text{Eq. 32}$$
$$I_L^{(S)}(\lambda, \theta) - [I^{(F)}(x, y, \lambda, \theta) - I_D^{(F)}(x, y, \lambda, \theta)] / I_L^{(F)}(\lambda, \theta)\} /$$
$$\{[I^{(U)}(x, y, \lambda, \theta) - I_D^{(U)}(x, y, \lambda, \theta)] /$$
$$I_L^{(U)}(\lambda, \theta) - [I^{(F)}(x, y, \lambda, \theta) - I_D^{(F)}(x, y, \lambda, \theta)] / I_L^{(F)}(\lambda, \theta)\}$$

Step 7. Average the Pixels in Grating Stacks

Figure 15:
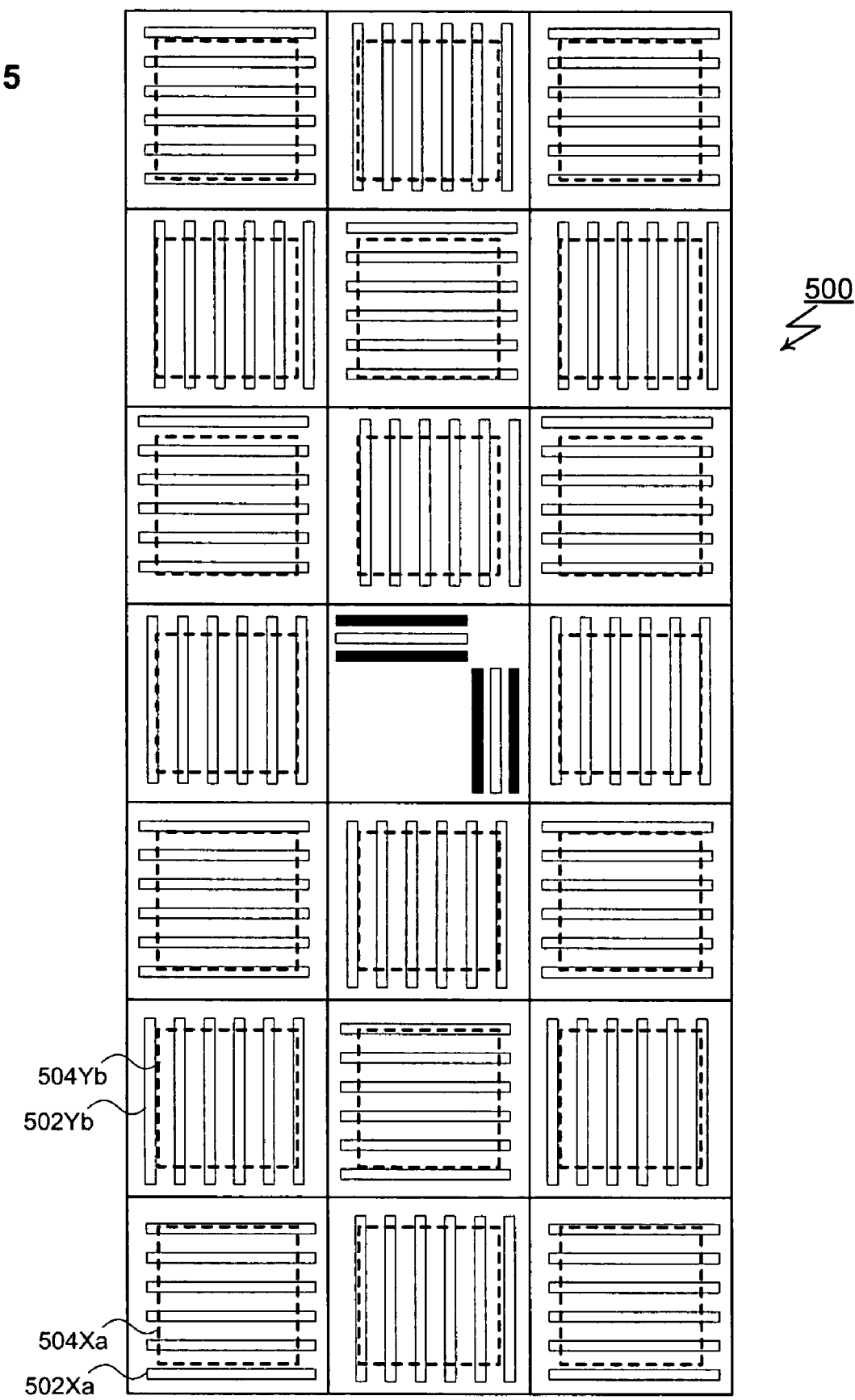
FIG. 15 shows a plan view of the overlay target made up of multiple grating stacks and the region of integration for each grating stack.

Referring to FIG. 15, the overlay target 500 and its grating stacks 502Xa, 502Ya, ... are located in the image by known methods of pattern recognition. A region of interest 504Xa of grating stack 502Xa is selected by discarding a border around the edges of grating stack 502Xa. The corrected intensity $I(x,y,\lambda,\theta)$ at the pixels in the region of interest 504Xa are averaged or added to produce one number per grating stack, per image. The same operation is performed for each grating stack in each image. The purpose of averaging the pixels in the region of interest is to increase the signal to noise ratio of the reading. The purpose of discarding the region between 502Xa and 504Xa is to exclude the diffraction tails thereby reducing cross talk between adjacent gratings. The typical size of a grating stack 502Xa is 10 μm by 10 μm and the typical width of the border that is discarded is 2 μm on the wafer. The typical size of the region of interest 504Xa is 6 μm by 6 μm. The typical number of pixels in the region of interest is 100×100 for a magnification of 100 and a CCD array with 6 μm by 6 μm square pixels. Each image is reduced to two arrays of $N_r$ numbers, one for the x-component, and the other for the y-component of overlay:

For k=1, 2, ..., $N_r$ $R^{(X)}(\lambda,\theta,r_k)$=average of $I(x,y,\lambda,\theta)$ over region of interest 504Xk

$R^{(Y)}(\lambda,\theta,r_k)$=average of $I(x,y,\lambda,\theta)$ over region of interest 504Yk

End for

Algorithm that Returns Overlay

Embodiment-A

Any function that satisfies properties in Eq. 5 has a Fourier series of the form:

$$R(\lambda, \theta, \xi) = \sum_{n=1}^{\infty} c_n(\lambda, \theta) \cos\left(\frac{2\pi n}{P} \xi\right) \quad \text{Eq. 40}$$

In Eq. 40, $c_n(\lambda,\theta)$ are Fourier coefficients that depend on wavelength and angle of incidence; and P is short for Pitch, or equivalently, period of the gratings. The solid line in FIG. 4 shows a Fourier series with 5 terms (up to $4^{th}$ harmonic)

fitted to actual reflectance measurements. The measurement data set, for each one of the x-y directions, after preprocessing of the images according to steps 1 to 7 above, comprises:

$$\{\{\{R(\lambda_i,\theta_j,r_k+\Delta x), i=1,2,\ldots,N_\lambda\} j=1,2,\ldots N_\theta\} k=1, 2,\ldots,N_r\} \quad \text{Eq. 42}$$

$N_\lambda$ is the number of discrete wavelengths at which measurements are taken. $N_\theta$ is the number of distinct angles of incidence (or different azimuthal angles) at which the measurements are taken. Either $N_\lambda$ or $N_\theta$, or both, can equal one. $N_\lambda$ is usually greater than one. $N_r$ is the number of grating stacks with different reticle offsets and $\Delta x$ is the unknown lithography alignment error, i.e., overlay. Overlay is determined according to the following algorithm:

$$\text{Estimate of } \Delta x = \underset{\Delta x}{\operatorname{argmin}}\{\chi^2(\Delta x)\} \quad \text{Eq. 44}$$

Overlay is estimated by minimizing a function $\chi^2(\Delta x)$ of one variable by standard methods of optimization (Dennis and Schnabel, Numerical Methods for Unconstrained Optimization and Nonlinear Equations, SIAM, 1983). The function $\chi^2(\Delta x)$ is a summation over all measurement wavelengths and/or angles. It is the sum of the square of the norm of a residual vector:

$$\chi^2(\Delta x) = \sum_{i=1}^{N_\lambda} \sum_{j=1}^{N_\theta} \left\| \text{residual of the least squares solution of } R(\lambda_i,\theta_j)=A(\Delta x)c(\lambda_i,\theta_j) \right\|^2 \quad \text{Eq. 46}$$

The linear least squares problem that is separately solved at each wavelength and angle of incidence is:

$$R(\lambda_i,\theta_j)=A(\Delta x)c(\lambda_j,\theta_j) \quad \text{Eq. 48}$$

$R(\lambda_i,\theta_j)$ is the $N_r \times 1$ column vector of measurements at the same wavelength and angle of incidence but at different reticle offsets. Ignoring measurement errors, $R(\lambda_i,\theta_j)$ is:

$$R(\lambda,\theta) = \begin{bmatrix} \text{measurement}(\lambda,\theta,r_1) \\ \text{measurement}(\lambda,\theta,r_2) \\ \vdots \\ \text{measurement}(\lambda,\theta,r_{N_r}) \end{bmatrix} = \begin{bmatrix} R(\lambda,\theta,r_1+\Delta x) \\ R(\lambda,\theta,r_2+\Delta x) \\ \vdots \\ R(\lambda,\theta,r_{N_r}+\Delta x) \end{bmatrix} \quad \text{Eq. 50}$$

$A(\Delta x)$ is an $N_r \times (M+1)$, real matrix that depends on the unknown overlay $\Delta x$ and the known offsets written to the reticle, $r_1, r_2, \ldots r_{N_r}$. The number of terms taken in the Fourier series in Eq. 40 is $M+1$.

$$A(\Delta x) = \begin{bmatrix} 1 & \cos(2\pi(r_1+\Delta x)/P) & \cdots & \cos(2\pi M(r_1+\Delta x)/P) \\ 1 & \cos(2\pi(r_2+\Delta x)/P) & \cdots & \cos(2\pi M(r_2+\Delta x)/P) \\ \vdots & \vdots & \ddots & \vdots \\ 1 & \cos(2\pi(r_{N_r}+\Delta x)/P) & \cdots & \cos(2\pi M(r_{N_r}+\Delta x)/P) \end{bmatrix} \quad \text{Eq. 52}$$

$c(\lambda_j,\theta_j)$ is the $(M+1)\times 1$ column vector of Fourier coefficients, which is never explicitly formed. The residual of the linear least squares problem is readily computed by the QR-factorization $A=QU$ where columns of $Q$ are orthonormal, i.e., $Q^T Q = I_{(M+1)\times(M+1)}$ is the $(M+1)$ by $(M+1)$ identity matrix. $U$ is an upper triangular square matrix (Golub and Van Loan, Matrix Computations, John Hopkins University Press) Diagonal entries of $U$ are nonzero provided that columns of $A(\Delta x)$ are linearly independent. The columns of $A(\Delta x)$ are linearly independent and orthogonal to each other when $M < N_r/2$ for any value of $\Delta x$. The residual vector is:

$$\text{residual of the least squares solution of } \{R(\lambda_j,\theta_j)=A(\Delta x)c(\lambda_j,\theta_j)\}=R(\lambda_i,\theta_j)-Q(\Delta x)Q^T(\Delta x)R(\lambda_i,\theta_j) \quad \text{Eq. 54}$$

The algorithm can be summarized as:

$$\text{Estimate of } \Delta x = \underset{\Delta x}{\operatorname{argmin}}\{\chi^2(\Delta x)\} \quad \text{Eq. 56}$$

$$\chi^2(\Delta x) = \sum_{i=1}^{N_\lambda} \sum_{j=1}^{N_\theta} \|R(\lambda_i,\theta_j) - Q(\Delta x)Q^T(\Delta x)R(\lambda_i,\theta_j)\|^2$$

There are many equivalent ways of doing the calculation in Eq. 46. For example, the residual of the linear system of equations can be obtained by solving the equation in the least squares sense to obtain the solution $c_{LSE}(\lambda_j,\theta_j)$, and calculating the residual vector as: $R(\lambda_i,\theta_j)-A(\Delta x)c_{LSE}(\lambda_j,\theta_j)$. This is less efficient than the method of Eq. 54.

Simple counting of unknowns and measurements leads to this account: There are $N_r \cdot N_\lambda N_\theta$ measurements. There are $(M+1) N_\lambda N_\theta$ unknown coefficients $c_n(\lambda_j, \theta_j)$ plus one unknown overlay $\Delta x$. Therefore, $M+1 < N_r$, i.e. $M=N-2$ is expected to lead to an over determined system of equations. This simple reasoning is correct except the matrix $A(\Delta x)$ is column rank deficient at values of $\Delta x$ separated by $P/(2 N_r)$. For the selection of reticle offsets in Eq. 7, $A(\Delta x)$ is column rank deficient at $\Delta x=0$, $\pm P/(2 N_r)$, $\pm P/(N_r)$, $\pm 3P/(2 N_r)$, ... The algorithm that minimizes $\chi^2(\Delta x)$ must not evaluate $\Delta x$ at exactly those points. This difficulty is eliminated in the following embodiment.

Algorithm that Returns Overlay

Embodiment-B

This is the preferred implementation. The overlay is estimated as:

$$\text{Estimate of overlay } \Delta x = \underset{\xi}{\operatorname{argmin}}\{\chi^2(\Delta x)\} \quad \text{Eq. 60}$$

$$\chi^2(\Delta x) = \sum_{i=1}^{N_\lambda} \sum_{j=1}^{N_\theta} (s^T(\Delta x)R(\lambda_i,\theta_j))^2$$

$$s(\Delta x) = \begin{bmatrix} \sin(2\pi(r_1+\Delta x)/P) \\ \sin(2\pi(r_2+\Delta x)/P) \\ \vdots \\ \sin(2\pi(r_{N_r}+\Delta x)/P) \end{bmatrix}$$

Although this algorithm can work when sin(.) in the expression of $s(\Delta x)$ above is replaced by other odd functions, sin(.) function is preferred because it enables finding the minimum of $\chi(\Delta x)$ without nonlinear minimization. The function $\chi^2(\Delta x)$ is equal to $$\chi^2(\Delta x) = \sin^2\left(\frac{2\pi}{P}(\Delta x - \Delta x_{ACTUAL})\right)\frac{N_r^2}{16}\sum_{i=1}^{N_\lambda}\sum_{j=1}^{N_\theta} c_1^2(\lambda_j, \theta_j) + O(2^{-N_r}) \qquad \text{Eq. 62}$$

Finding the root of $\sin^2(.)$ does not require nonlinear minimization. Overlay, $\Delta x_{ACTUAL}$ is estimated by fitting the expression below to calculated samples of $\chi^2(\Delta x)$.

$$\chi^2(\Delta x) = a + b\cos\left(\frac{4\pi}{P}\Delta x\right) + c\sin\left(\frac{4\pi}{P}\Delta x\right) \qquad \text{Eq. 64}$$

$$\text{Estimate of } \Delta x_{ACTUAL} = \frac{P\mathrm{atan2}(-c, -b)}{4\pi}$$

Coefficients a, b, and c are obtained by linear least squares fitting and $\Delta x_{ACTUAL}$ has an explicit expression in terms of b, c, and P. There is no nonlinear minimization. Alternatively, Eq. 64 can be applied to samples of $\chi^2(\Delta x)$ calculated according to Eq. 56 in Embodiment-A.

What is claimed is:

1. An apparatus for measuring overlay within a sample, where the sample includes an overlay target that is formed as a series of grating stacks each having an upper and lower grating, each grating stack having a unique offset between its upper and lower grating, the apparatus comprising:
an illumination source that generates an optical beam;
illumination optics configured to direct a probe beam portion of the optical beam to be reflected by the target;
a detector array configured to convert an image into corresponding output signals;
collection optics configured to convey an image of the target to the detector by collecting some portion of the reflected probe beam, where the numerical aperture of the collection optics is larger than the numerical aperture of the illumination optics and with the numerical apertures of the illumination and collection optics are selected so that the unit cells of gratings are not resolved, the grating stacks are resolved and they appear to have a uniform color within the image of the overlay target; and
a processor configured to measure overlay based on the output signals of the detector.

2. An apparatus as recited in claim 1, wherein the numerical aperture of the illumination optics is less than 0.5 and the numerical aperture of the collection optics is greater than or equal to 0.5.

3. An apparatus as recited in claim 1, wherein the numerical aperture of the illumination optics is less then or equal to 0.3.

4. An apparatus as recited in claim 1, wherein an image is acquired at a wavelength that is shorter than 400 nm.

5. An apparatus as recited in claim 1, wherein the image of the overlay target is acquired as a function of wavelength.

6. An apparatus as recited in claim 5, that further comprises:
reference optics for directing a reference beam portion of the optical beam to be mixed with the reflected probe beam; and
a modulator for selectively altering the distance traveled by the reference beam.

7. An apparatus as recited in claim 5, wherein the probe beam is directed at a non-normal angle of incidence to be reflected by the target within the sample.

8. An apparatus as recited in claim 1, wherein the image of the overlay target is acquired as a function of angle of incidence of the probe beam.

9. An apparatus as recited in claim 1, wherein the image of the overlay target is acquired as a function of the azimuth angle between the plane of incidence of the probe beam and a line that lies in the plane of the overlay target.

10. An apparatus as recited in claim 1, wherein the detected image is a darkfield image.

11. An apparatus as recited in claim 1, wherein the detected image is a darkfield image wherein at least one of the angle of incidence or angle of reflection of the probe beam or the angle of reflection is off axis such that the specular reflection from the overlay target does not pass through the aperture of the collection objective.

12. An apparatus as recited in claim 1, wherein the processor is configured to compensate for the dark current of the detector array.

13. An apparatus as recited in claim 1, wherein the processor is configured to compensate for flare in the optical system.

14. An apparatus as recited in claim 1, which further comprises a photodetector positioned to measure the intensity of the intensity of the optical beam generated by the illumination source.

15. An apparatus as recited in claim 14, wherein the photodetector comprises one or more elements within the detector array.

16. A method for measuring overlay between layers within a sample formed by a lithography process where the sample includes an overlay target that is formed as a series of grating stacks each including an upper and lower grating, each grating stack having a unique offset between its upper and lower gratings, the method comprising:
focusing an optical probe beam to be reflected by the target using a set of illumination optics;
obtaining one or more images of the target using a set of collection optics, where the numerical aperture of the collection optics is larger than the numerical aperture of the illumination optics and with the numerical apertures of the illumination and collection optics are selected so that the unit cells of gratings are not resolved, the grating stacks are resolved and they appear to have a uniform color within the image of the overlay target;
converting each image into corresponding output signals;
analyzing the output signals to measure overlay within the sample; and
using the measured overlay to control the lithography process.

17. A method as recited in claim 16, in which the one or more images are obtained as a function of one or more independent variables selected from the group of: probe beam wavelength, probe beam polarization state, angle of incidence of the probe beam on the overlay target and azimuth angle of the probe beam on the overlay target.

18. A method as recited in claim 17, that further comprises:
analyzing the output signals corresponding to an image to obtain optical response information for each grating stack in the overlay target;
constructing a mapping between the respective offsets defined by the upper and lower gratings in the series of grating stacks and optical response information; and
finding an offset for which the optical response information varies in a symmetrical fashion for greater and lesser offsets.

19. A method as recited in claim 18, that further comprises:
defining a Fourier series to represent the optical response of the grating stacks, where the Fourier series is an even function of reticle offset, shifted by an unknown amount; and
solving the coefficients of the Fourier series to obtain the unknown shift amount by fitting the Fourier series to the optical response information.

20. A method as recited in claim 18, that further comprises:
generating an optical reference beam;
modulating the distance traveled by the reference beam; and
mixing the modulated reference beam into the reflected probe beam.

* * * * *